(12) United States Patent
Takasugi et al.

(10) Patent No.: US 7,579,624 B2
(45) Date of Patent: Aug. 25, 2009

(54) IMAGE DISPLAY HAVING A CAPACITANCE VARYING UNIT AND METHOD OF DRIVING SAME

(75) Inventors: Shinji Takasugi, Kanagawa (JP); Kaoru Kusafuka, Kanagawa (JP)

(73) Assignee: Kyocera Corporation, Kyoto (JP)

( * ) Notice: Subject to any disclaimer, the term of this patent is extended or adjusted under 35 U.S.C. 154(b) by 472 days.

(21) Appl. No.: 11/213,933

(22) Filed: Aug. 30, 2005

(65) Prior Publication Data

US 2006/0043375 A1 Mar. 2, 2006

(30) Foreign Application Priority Data

Aug. 31, 2004 (JP) ............................. 2004-252753
Dec. 27, 2004 (JP) ............................. 2004-377348
Aug. 25, 2005 (JP) ............................. 2005-245049

(51) Int. Cl.
*H01L 29/04* (2006.01)
(52) U.S. Cl. ............... 257/72; 257/E27.111; 345/87
(58) Field of Classification Search ............ 257/40, 257/59, 72, E27.111; 345/87
See application file for complete search history.

(56) References Cited

U.S. PATENT DOCUMENTS

| 6,858,991 | B2 | 2/2005 | Miyazawa | |
|---|---|---|---|---|
| 2003/0062844 | A1* | 4/2003 | Miyazawa | 315/169.3 |
| 2003/0193457 | A1* | 10/2003 | Wang et al. | 345/84 |

FOREIGN PATENT DOCUMENTS

CN     1405750 A     3/2003

OTHER PUBLICATIONS

S. Ono, et al., "Pixel Circuit for a-Si AM-OLED" IDW 03 pp. 255-258.

* cited by examiner

*Primary Examiner*—Thomas L Dickey
(74) *Attorney, Agent, or Firm*—Birch, Stewart, Kolasch & Birch, LLP.

(57) ABSTRACT

An image display includes a light emitting unit that emits light via energization; a driver that includes at least a first terminal and a second terminal, and that controls light emission by the light emitting unit according to a potential difference which is applied between the first terminal and the second terminal and is higher than a predetermined driving threshold; a threshold voltage detector that detects a threshold voltage corresponding to the driving threshold between the first terminal and the second terminal of the driver; and a capacitance varying unit that is connected to the driver.

2 Claims, 16 Drawing Sheets

IMAGE DISPLAY HAVING A CAPACITANCE VARYING UNIT AND METHOD OF DRIVING SAME

BACKGROUND OF THE INVENTION

1. Field of the Invention

The present invention relates to an image display and a method of driving the image display, more particularly to an image display which can reduce fluctuation in luminance due to parasitic capacitance.

2. Description of the Related Art

Conventionally, an image display with an organic light emitting diode which causes light emission through control of electric current has been proposed. Such an OLED has a function of emitting light via recombination of positive holes and electrons injected into a light emitting layer.

In such an image display, a thin film transistor (TFT), which is formed from, for example, amorphous silicon or polycrystalline silicon, and an organic light emitting diode constitutes each pixel. The luminance is controlled through setting of appropriate value of electric current for each pixel.

FIG. 17 is a diagram of a structure of a pixel circuit corresponding to one pixel in a conventional image display. In FIG. 17, the pixel circuit includes an organic light emitting diode OLED, an organic light emitting diode capacitor $C_{OLED}$, a driving transistor Td, a threshold voltage detecting transistor Tth, a supplementary capacitor Cs, a switching transistor T1, and a switching transistor T2.

The driving transistor Td serves to control an amount of electric current flowing through the organic light emitting diode OLED according to potential difference applied between a gate electrode and a source electrode. The threshold voltage detecting transistor Tth, on attaining an ON state, electrically connects the gate electrode and the drain electrode of the driving transistor Td, to cause electric current to flow from the gate electrode to the drain electrode of the driving transistor Td until the potential difference between the gate electrode and the source electrode of the driving transistor Td reaches a threshold voltage Vth of the driving transistor Td. Thus the threshold voltage detecting transistor Tth serves to detect a threshold voltage Vth of the driving transistor Td.

The organic light emitting diode OLED has a characteristic of emitting light when a potential difference equal to or higher than a threshold voltage (i.e., potential difference between an anode and a cathode) is generated to cause electric current to flow. Specifically, the organic light emitting diode OLED has at least an anode layer and a cathode layer formed from Aluminum (Al), Copper (Cu), Indium Tin Oxide (ITO), or the like, and a light emitting layer formed from an organic material such as pthalcyanine, tris-aluminum complex, benzoquinolinolato, and beryllium complex, between the anode layer and the cathode layer. The organic light emitting diode OLED emits light by recombining the positive hole and the electron injected to the light emitting layer. The organic light emitting diode capacitor $C_{OLED}$ is an equivalent representation of capacitance of the organic light emitting diode OLED.

The driving transistor Td, the threshold voltage detecting transistor Tth, the switching transistor T1, and the switching transistor T2 are, for example, thin film transistors. Though the drawings referred to below do not clearly show channel type of each thin film transistor, i.e., whether the TFT is n-type or p-type, the TFT is one of n-type and p-type and should be interpreted in accordance with the description below.

A power source line 10 supplies power to the driving transistor Td and the switching transistor T2. A Tth control line 11 supplies a signal for controlling the threshold voltage detecting transistor Tth. A merge line 12 supplies a signal for controlling the switching transistor T2. A scan line 13 supplies a signal for controlling the switching transistor T1. An image data line 14 supplies image data.

The pixel circuit with the above-described structure operates through four periods, i.e., a preparing period, a threshold voltage detecting period, a writing period, and a light emitting period. In the preparing period, a positive potential of a predetermined level (Vp, Vp>0) is applied to the power source line 10 to render the threshold voltage detecting transistor Tth OFF, the switching transistor T1 OFF, the driving transistor Td ON, and the switching transistor T2 ON. As a result, electric current flows sequentially from the power source line 10, the driving transistor Td, to the organic light emitting diode capacitor $C_{OLED}$, thereby accumulating electric charges in the organic light emitting diode capacitor $C_{OLED}$.

In the threshold voltage detecting period, zero potential is applied to the power source line 10, to render the threshold voltage detecting transistor Tth ON, and to connect the gate and the drain of the driving transistor Td. Thus, the electric charges accumulated in the supplementary capacitor Cs and the organic light emitting diode capacitor $C_{OLED}$ are discharged to cause electric current to flow from the driving transistor Td to the power source line 10. When the potential difference between the gate and the drain of the driving transistor Td reaches the level of the threshold voltage Vth corresponding to driving threshold of the driving transistor Td, the driving transistor Td is turned OFF.

In the writing period, the power source line 10 maintains zero potential, while the switching transistor T1 is turned ON, and the switching transistor T2 is turned OFF, to discharge the electric charges accumulated in the organic light emitting diode capacitor $C_{OLED}$. As a result, the electric current flows from the organic light emitting diode capacitor $C_{OLED}$, the threshold voltage detecting transistor Tth, and to the supplementary capacitor Cs, to accumulate electric charges in the supplementary capacitor Cs. In other words, the electric charges accumulated in the organic light emitting diode capacitor $C_{OLED}$ moves to the supplementary capacitor Cs.

In the light emitting period, a negative potential of a predetermined level ($-V_{DD}$, $V_{DD}>0$) is applied to the power source line 10, to render the driving transistor Td ON, the threshold voltage detecting transistor Tth OFF, and the switching transistor T1 OFF. As a result, an electric current flows from the organic light emitting diode OLED, the driving transistor Td, to the power source line 10, thereby causing the organic light emitting diode OLED to emit light.

For more detailed information on conventional technique, see, for example, S. Ono et al., Proceedings of IDW, '03, 255 (2003).

The conventional image display as shown in FIG. 18, includes a parasitic capacitor CgdTd and a parasitic capacitor CgsTd in the vicinity of the gate of the driving transistor Td, and a parasitic capacitor CgdTth and a parasitic capacitor CgsTth in the vicinity of the gate of the threshold voltage detecting transistor Tth.

The parasitic capacitors are known to cause fluctuation in luminance of the organic light emitting diode OLED. Hence, technique to effectively minimize negative effect of the parasitic capacitors is conventionally desired.

SUMMARY OF THE INVENTION

An image display according to one aspect of the present invention includes a light emitting unit that emits light according to current flowing therethrough; a driver that includes a first terminal and a second terminal. The driver controls the light emitted from the light emitting unit according to a potential difference which is applied between the first terminal and the second terminal and which is higher than a predetermined driving threshold. The image display also includes a threshold voltage detector that detects a threshold voltage corresponding to the driving threshold between the first terminal and the second terminal of the driver; and a capacitance varying unit that is connected to the driver.

An image display according to another aspect of the present invention includes a variable capacitor including a first electrode, an insulation layer disposed on the first electrode, a channel layer disposed on the insulation layer, and a second electrode disposed on the channel layer and smaller in area than the first electrode.

A method of driving an image display according to still another aspect of the present invention is for an image display that includes a light emitting unit that emits light according to current flowing therethrough; a driver transistor having a gate electrode, a source electrode, and a drain electrode, one of the source electrode and the drain electrode being electrically connected to the light emitting unit; a switching transistor that electrically connects the gate electrode and the one of the source electrode and the drain electrode according to a scan signal; and a capacitance varying unit that is connected to the gate electrode. The method includes electrically connecting the gate electrode and the other of the source electrode and the drain electrode by turning on the driver transistor and the switching transistor to set to a driving threshold a potential of the gate electrode with respect to the other of the source electrode and the drain electrode; supplying a luminance potential of the light emitting unit to the gate electrode by turning off the driver transistor and turning on the switching transistor; emitting light from the light emitting unit according to the luminance potential which is supplied to the gate electrode by turning off the driver transistor and turning off the switching transistor so that current flows through the light emitting unit; and setting a capacitance of the capacitance varying unit at the electrically connecting and a capacitance of the capacitance varying unit at the emitting so that the capacitances are different, to reduce an influence of parasitic capacitance of the driver transistor and the switching transistor on the luminance of the light emitting unit.

DETAILED DESCRIPTION OF THE PREFERRED EMBODIMENTS

In the following, exemplary embodiments of an image display according to the present invention will be described in detail with reference to the accompanying drawings. It should be noted that the present invention is not limited to the embodiments described below.

Figure 1:
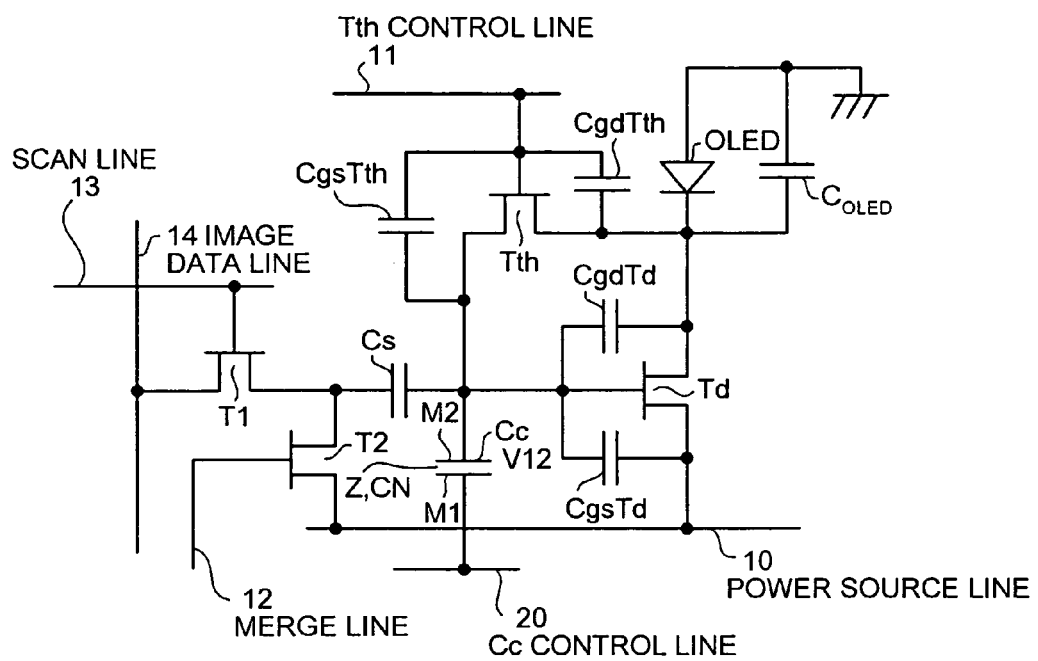
FIG. 1 is a diagram of a structure of a pixel circuit corresponding to one pixel in an image display according to a first embodiment of the present invention.
Figure 18:
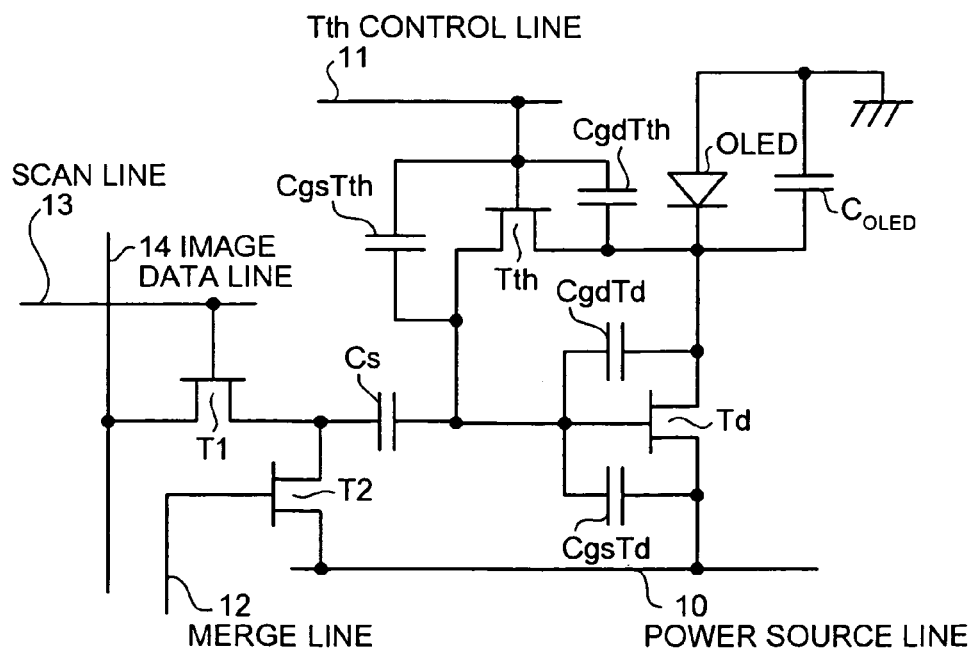
FIG. 18 is a diagram of a parasitic capacitance or the like generated in the pixel circuit shown in FIG. 17.

FIG. 1 is a diagram of a structure of a pixel circuit corresponding to one pixel in an image display according to a first embodiment of the present invention. In FIG. 1, elements corresponding to those shown in FIG. 18 are denoted by the same reference characters. A pixel circuit shown in FIG. 1 further includes a variable capacitor Cc which serves as a capacitance varying unit and a Cc control line 20 which serves to control the variable capacitor Cc.

The variable capacitor Cc serves to reduce the influence of the parasitic capacitance mentioned above. The variable capacitor Cc includes an insulation layer Z and a channel layer CN interposed between a first electrode M1 and a second electrode M2, and the layer structure thereof is substantially the same with the layer structure of the thin film transistor. The first electrode M1 is connected to the Cc control line 20. The second electrode M2 is connected to a gate of a driving transistor Td.

Figure 2:
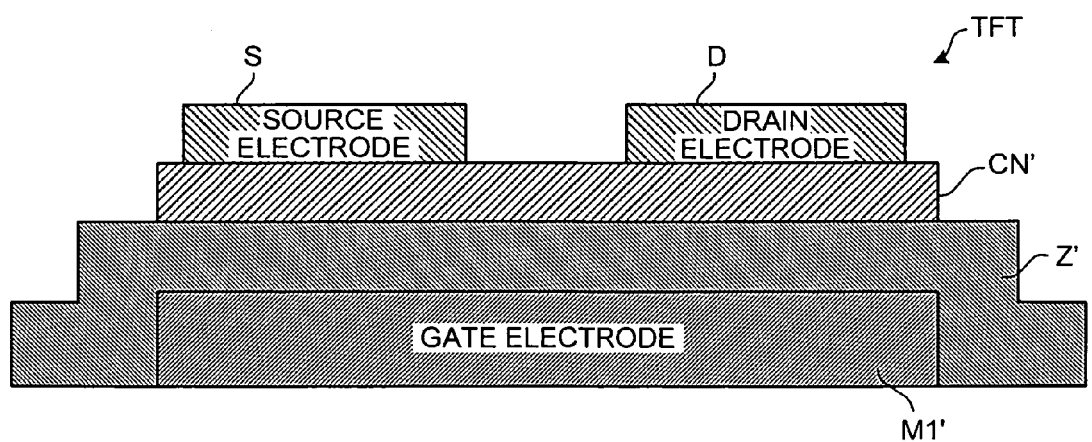
FIG. 2 is a sectional view of a thin film transistor TFT shown in FIG. 1.

FIG. 2 is a sectional view of the structure of the thin film transistor TFT shown in FIG. 1. The thin film transistor shown in FIG. 2 includes a gate electrode M1', an insulation layer Z', a channel layer CN', a source electrode S, and a drain electrode D formed sequentially in this order from a substrate. The gate electrode M1', the source electrode S, and the drain electrode D are formed, for example, from a metallic material such as Aluminum (Al), Aluminum Neodymium (AlNd), and Molybdenum-Tungsten (MoW). The insulation layer Z' is formed, for example, from an insulating material such as SiN type material, or SiO type material. The channel layer CN' is formed, for example, from a semiconductor material such as amorphous silicon and polycrystalline silicon.

In the thin film transistor, voltage between the gate electrode M1' and the source electrode S produces an electric field which causes change in electric conductivity of the channel layer CN', which in turn induces change in resistance between the drain electrode D and the source electrode S, whereby the amount of electric current flowing between the drain electrode D and the source electrode S can be controlled. For example, when the thin film transistor of FIG. 2 is employed as the driving transistor Td, the amount of electric current flowing through the organic light emitting diode OLED can be controlled according to the potential difference applied between the gate electrode and the source electrode.

Figure 3A:
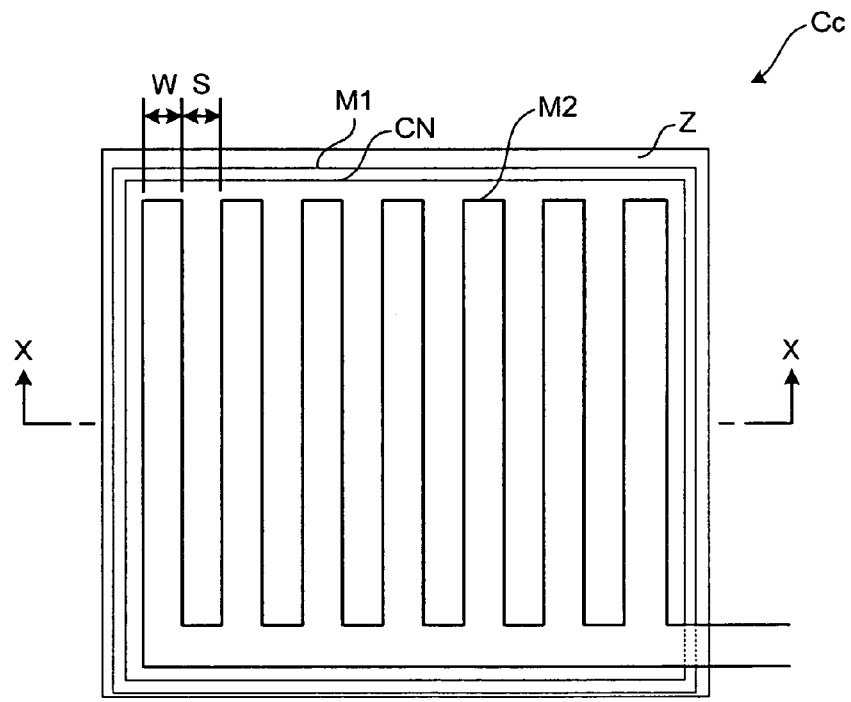
FIG. 3A is a schematic plan view of a structure of a variable capacitor Cc shown in FIG. 1.
Figure 3B:
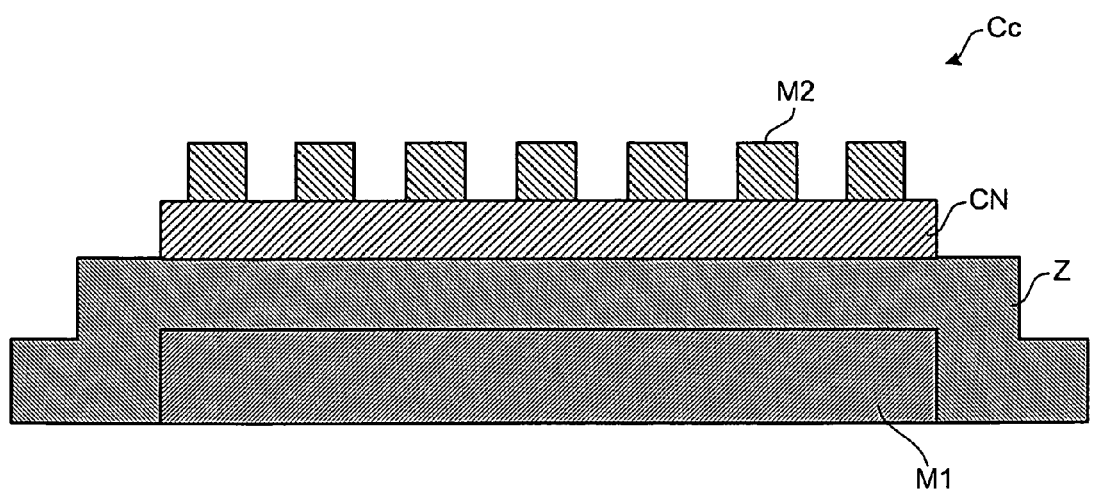
FIG. 3B is a sectional view taken along X-X of FIG. 3A of a structure of the variable capacitor Cc shown in FIG. 1.

FIG. 3A is a schematic plan view of a structure of the variable capacitor Cc shown in FIG. 1. Similarly, FIG. 3B is a sectional view along a line X-X of the structure of the variable capacitor Cc shown in FIG. 1. The variable capacitor Cc of FIGS. 3A and 3B includes a first electrode M1, an insulation layer Z, a channel layer CN, and a second electrode M2, formed in this order. The first electrode M1 is formed from a metallic material such as Al, AlNd, and MoW, and has a rectangular shape when viewed from above. The insulation layer Z is arranged on the first electrode M1 and formed from an insulation material of SiN type, SiO type or the like. The channel layer CN is arranged between the insulation layer Z and the second electrode M2 so as to contact with the second electrode M2. The channel layer CN is formed from a semiconductor material such as polycrystalline silicon or amorphous silicon. The second electrode M2 is formed to have a smaller size than the first electrode M1. The second electrode M2 is formed in an interdigitated shape with a plurality of fingers when viewed from above, for example, and the outer periphery thereof is of a crank-like shape.

The channel layer CN has a characteristic as to function as an insulator when potential difference V12 between the first electrode M1 and the second electrode M2 is small (here, the potential difference V12 can be represented as V1−V2, where V1 represents the potential on the first electrode M1 and V2 represents the potential on the second electrode M2). Then, the insulation layer Z and the channel layer CN work as dielectric, whereby the capacitance of the variable capacitor Cc becomes proportionate to the size of an area where the first electrode M1 and the second electrode M2 overlap.

On the other hand, when the potential difference V12 between the first electrode M1 and the second electrode M2 is large, the channel layer CN functions as a conductor in an area directly below and close to the second electrode M2. Then, since the gap between the fingers of the second electrode M2 is sufficiently small, the entire surface of the second electrode M2 works as a conductor to cause only the insulation layer Z to work as a dielectric. Then, the capacitance of the variable capacitor Cc becomes proportionate to the size of an area where the first electrode M1 and the channel layer CN overlap.

Further, the variable capacitor Cc has a similar layer structure to the layer structure of the thin film transistor TFT which includes the gate electrode M1', the insulation layer Z', the channel layer CN', the source electrode S, and the drain electrode D formed in this order as shown in FIG. 2, and can be manufactured through a similar manufacturing process to the thin film transistor TFT. The driving transistor Td, the threshold voltage detecting transistor Tth, the switching transistor T1, and the switching transistor T2 shown in FIG. 1 are of the similar layer structure with the thin film transistor TFT shown in FIG. 2.

The thin film transistor TFT and the variable capacitor Cc mentioned above are formed according to the conventionally known thin film forming technique. Specifically, the thin film transistor TFT is formed according to the following process. Firstly a metallic material, which later becomes a gate electrode, is deposited to a predetermined thickness (200 to 400 nanometers (nm), for example) via sputtering or the like, followed by photolithography of conventionally known type, and patterning through dry etching or the like, whereby the gate electrode M1' is formed.

Secondly, an insulation material, which later becomes the insulation layer Z' and a semiconductor material, which later becomes the channel layer CN', are formed to a predetermined thickness (300 to 400 nm thickness for the insulation material and 100 to 300 nm thickness for the semiconductor material, for example), followed by photolithography and patterning via dry etching or the like, whereby the insulation layer Z' and the channel layer CN' are formed. Finally, a metallic material, which later becomes the source electrode S and the drain electrode D, are deposited to a predetermined thickness (200 to 400 nm thickness for example), followed by photolithography and patterning via dry etching or the like, whereby the source electrode S and the drain electrode D are formed.

On the other hand, the variable capacitor Cc can be formed according to the following process. Firstly, a metallic material, which later becomes the first electrode M1, is deposited to a predetermined thickness (200 to 400 nm, for example) via sputtering or the like, followed by photolithography and patterning via dry etching or the like, whereby the first electrode M1 is formed. Secondly, an insulation material, which later becomes the insulation layer Z and a semiconductor material, which later becomes the channel layer CN, are deposited to a predetermined thickness (300-400 nm thickness for the insulation material and 100 to 300 nm thickness for the semiconductor material, for example) via Chemical Vapor Deposition (CVD) or the like, followed by photolithography and patterning via dry etching or the like, whereby the insulation layer Z and the channel layer CN are formed.

Finally, a metallic material, which later becomes the second electrode M2, is deposited to a predetermined thickness (200 to 400 nm thickness, for example) via sputtering or the like, followed by photolithography and patterning via dry etching or the like, whereby the second electrode M2 is formed.

In FIGS. 2, 3A, and 3B, the channel layer CN' of the thin film transistor TFT and the channel layer CN of the variable capacitor Cc are formed with the same material to a substantially the same thickness (preferably the difference in thickness is within ±80 nm, and more preferably within ±40 nm). In addition, the insulation layer Z' of the thin film transistor TFT and the insulation layer Z of the variable capacitor Cc are formed with the same material to a substantially the same thickness (preferably the difference in thickness is within ±80 nm, and more preferably within ±40 nm).

Further, the gate electrode M1' of the thin film transistor TFT and the first electrode M1 of the variable capacitor Cc, and the source electrode S and the drain electrode D of the thin film transistor TFT and the second electrode M2 of the variable capacitor Cc are respectively formed with the same material to a substantially the same thickness (preferably the difference in thickness is within ±60 nm, and more preferably within ±30 nm).

Since the variable capacitor Cc is formed with the same layer structure with the thin film transistor TFT employed as the driving transistor Td, the threshold voltage detecting transistor Tth, or the like, these elements can be formed with the same material, and further the electrode, the channel layer, and the insulation layer can collectively be formed in the same process. Hence, the provision of the variable capacitor can be well prevented from causing the decrease in productivity.

Figure 4:
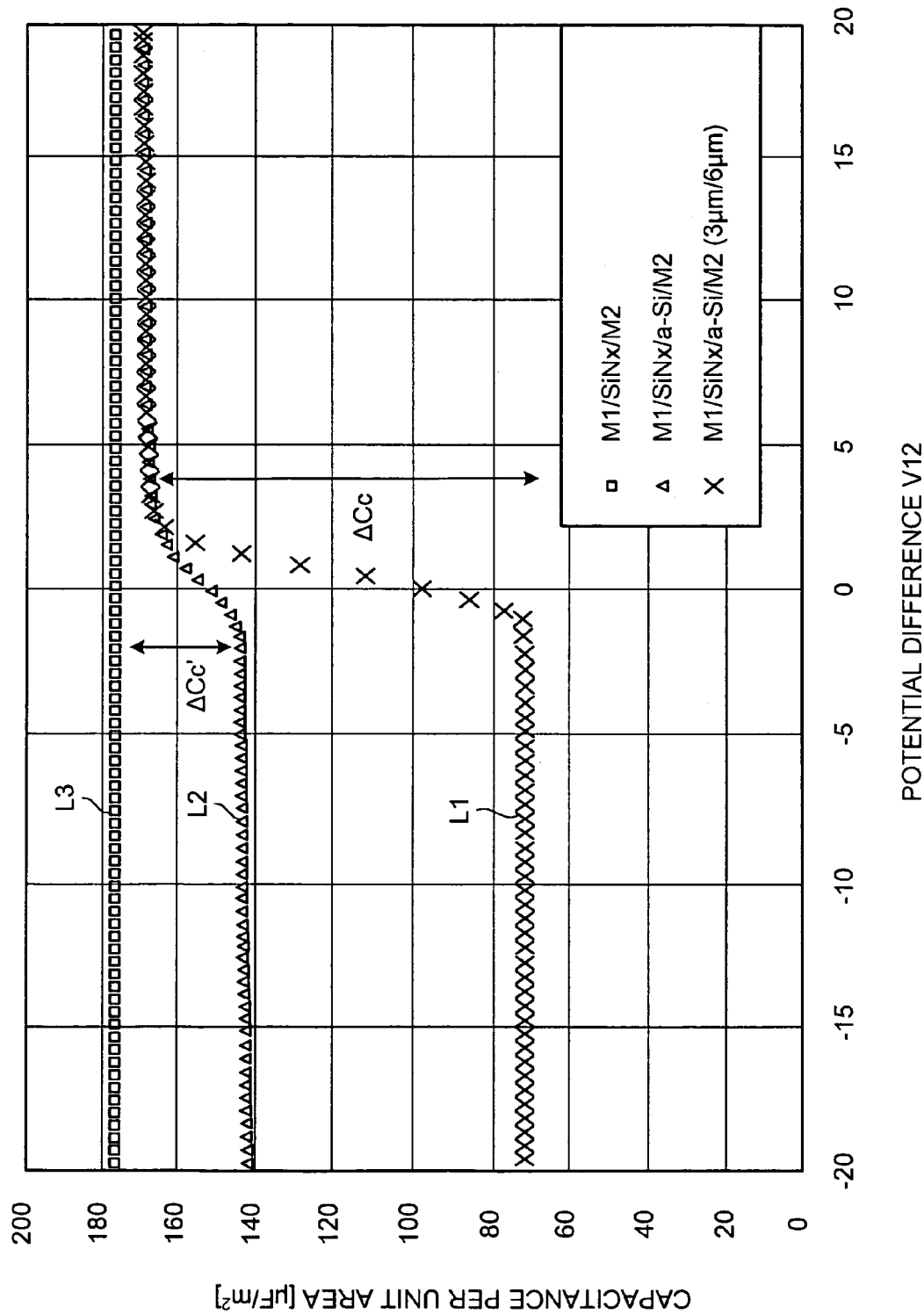
FIG. 4 is a graph of changes in per-unit-area capacitance of the variable capacitor Cc shown in FIGS. 1, 3A, and 3B.

FIG. 4 is a graph of changes in capacitance per unit area of the variable capacitor Cc shown in FIGS. 1, 3A, and 3B. In the drawings, characteristic lines L1 to L3 represent capacitances per unit area of the variable capacitor Cc when the potential difference V12 between the first electrode M1 and the second electrode M2 (see FIGS. 1, 3A, and 3B) changes from −20V to 20V.

It should be noted that the characteristic line L1 represents the capacitance when the width of the finger of the second electrode M2 shown in FIGS. 3A and 3B is 3 μm and a gap between the fingers is 6 μm. As can be seen from the characteristic line L1, when the potential difference V12 is equal to or higher than 2.5V which is a first threshold, the unit capacitance of the variable capacitor Cc is substantially fixed at 170 μF/m². On the other hand, when the potential difference V12 is equal to or lower than −2.5 V which is a second threshold, the unit capacitance of the variable capacitor Cc is substantially fixed at 70 μF/m². Here, the difference between a maximum value and a minimum value of the unit capacitance of the variable capacitor Cc is represented as ΔCc.

Thus, as can be seen from the characteristic line L1, the unit capacitance of the variable capacitor Cc can be rendered the maximum value (170 in FIG. 4) or the minimum value (70 in FIG. 4) through the binary control of the potential difference V12.

In the drawing, the characteristic lines L2 and L3 are plotted for comparison with the characteristic line L1. The characteristic line L2 represents the capacitance when the second electrode M2 is formed to have a substantially rectangular plane shape with the same size and shape with the first electrode M1 instead of the interdigitated (comb-like) shape. Here, with the comparison between the characteristic line L1 and the characteristic line L2, the difference ΔCc corresponding to the characteristic line L1 can be set larger than the difference ΔCc' between the maximum value and the minimum value of the unit capacitance of the variable capacitor Cc.

Such can be assumed to be attributable to the shape of the second electrode M2 which has plural finger-like portions when viewed from above. Since the second electrode M2 has an outer periphery of a crank-like shape, an area of the channel layer CN contacting with the second electrode M2 is larger, whereby a larger area of the channel layer CN can be secured which functions as a conductor at a larger potential difference between the first electrode M1 and the second electrode M2. Thus, the value of ΔCc' can be made larger when the second electrode M2 has the plurality of fingers when viewed from above.

When the second electrode M2 has plural finger-like portions, an interval between adjacent finger-like portions is preferably in the range of 4 μm to 8 μm, and the width of the finger is preferably in the range of 1 μm to 5 μm. The characteristic line L3 represents the capacitance when the variable capacitance Cc does not have the channel layer CN. Here, the unit capacitance of the variable capacitor Cc is constant regardless of the potential difference V12.

Next, an operation of the first embodiment will be described with reference to FIG. 5. Hereinbelow, the operation in four periods, i.e., the preparing period, the threshold voltage detecting period, the writing period, and the light emitting period, will be described. The operation described below is controlled by a controlling unit (not shown).

Preparing Period

Figure 5:
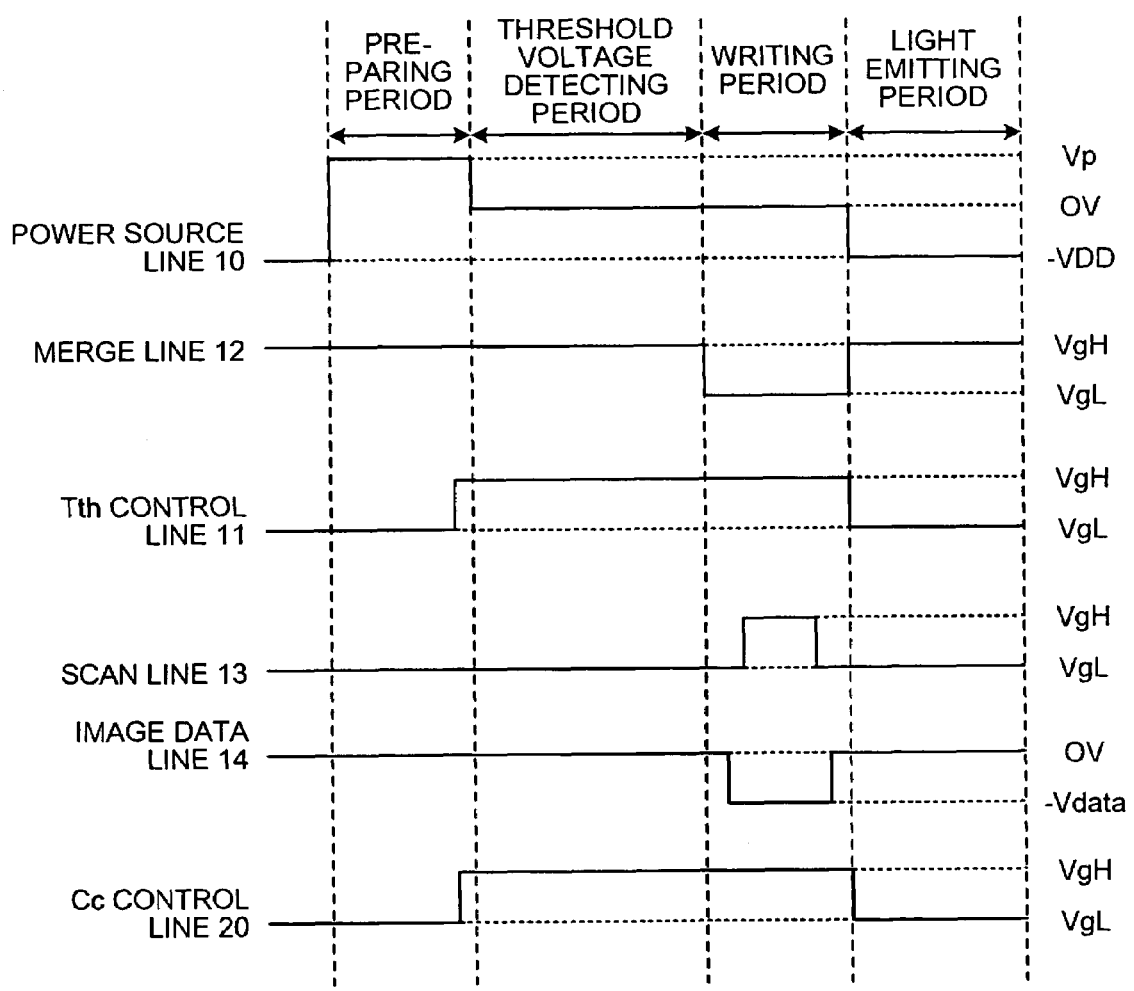
FIG. 5 is a sequence diagram of an operation according to the first embodiment.
Figure 6:
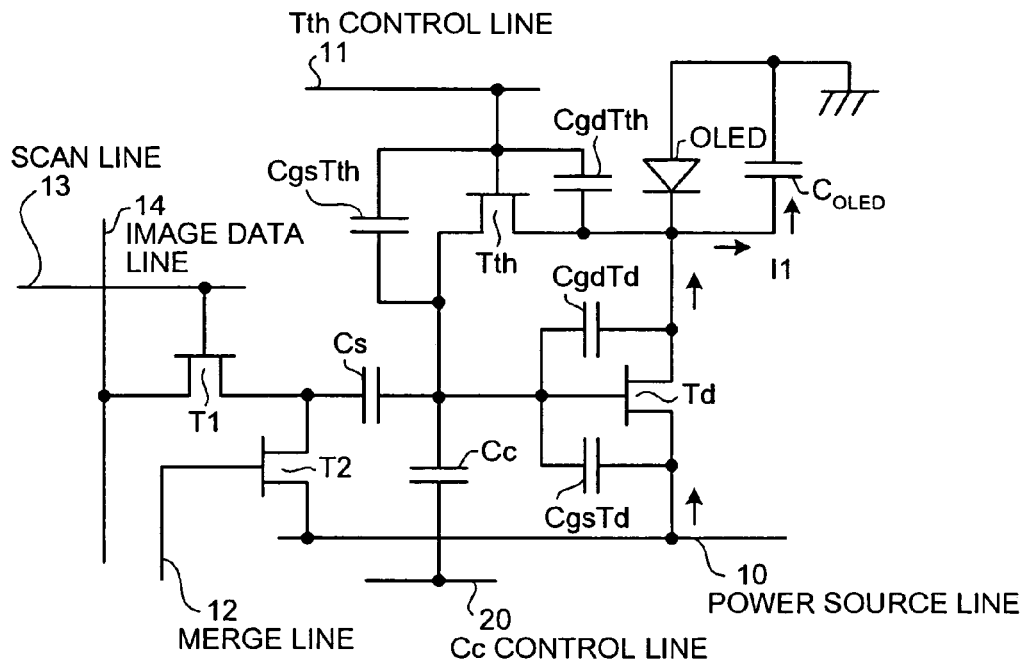
FIG. 6 is an explanatory diagram of an operation in a preparing period shown in FIG. 5.

In the preparing period shown in FIG. 5, a potential of the power source line 10 is set to a high potential (Vp), a potential of the merge line 12 is set to a high potential (VgH), a potential of the Tth control line 11 is set to a low potential (VgL), a potential of the scan line 13 is set to a low potential (VgL), a potential of the image data line 14 is set to zero potential, and a potential of the Cc control line 20 is set to a low potential (VgL). Hence, as shown in FIG. 6, the threshold voltage detecting transistor Tth is turned OFF, the switching transistor T1 is turned OFF, the driving transistor Td is turned ON, and the switching transistor T2 is turned ON. Then, the electric current I1 flows sequentially from the power source line 10, the driving transistor Td, and to the organic light emitting diode capacitor $C_{OLED}$. Thus, the electric charges are accumulated in the organic light emitting diode capacitor $C_{OLED}$. The electric charges are accumulated in the organic light emitting diode in the preparing period, so that the electric current can be supplied up until Ids attains zero in the driving threshold detection.

Threshold Voltage Detecting Period

Figure 7:
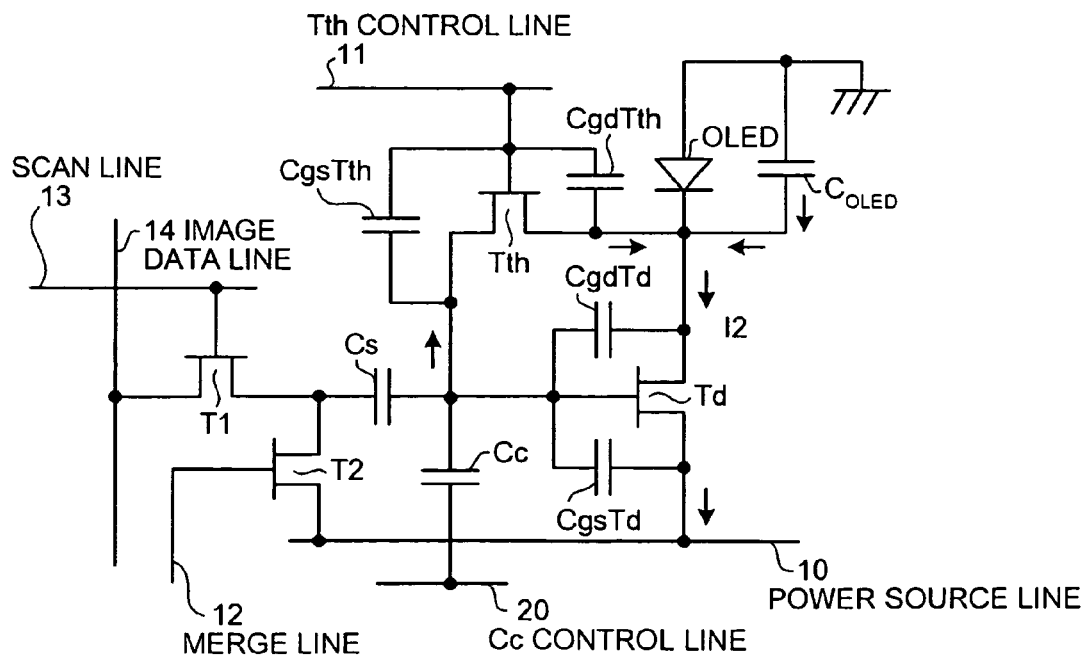
FIG. 7 is an explanatory diagram of an operation in a threshold voltage detecting period shown in FIG. 5.

In the threshold voltage detecting period, a potential of the power source 10 is set to zero potential, a potential of the merge line 12 is set to a high potential (VgH), a potential of the Tth control line 11 is set to a high potential (VgH), a potential of the scan line 13 is set to a low potential (VgL), a potential of the image data line 14 is set to zero potential, and a potential of the Cc control line 20 is set to a high potential (VgH). Thus, as shown in FIG. 7, the threshold voltage detecting transistor Tth is turned ON, and the gate and the drain of the driving transistor Td are connected.

Further, the electric charges accumulated in the supplementary capacitor Cs and the organic light emitting diode capacitor $C_{OLED}$ are discharged, to cause electric current I2 to flow from the driving transistor Td to the power source line 10 in this order. When the potential difference between the gate and the drain of the driving transistor Td reaches the threshold voltage Vth, the driving transistor Td is turned OFF and the threshold voltage Vth of the driving transistor Td is detected.

Writing Period

In the writing period, the gate potential of the driving transistor Td is changed to a desired potential through the supply of data potential (−Vdata) to Cs. Specifically, a potential of the power source line is set to zero potential, a potential of the merge line 12 is set to a low potential (VgL), a potential of the Tth control line 11 is set to a high potential (VgH), a potential of the scan line 13 is set to a high potential (VgH), a potential of the image data line 14 is set to a data potential (−Vdata), and a potential of the Cc control line 20 is set to a high potential (VgH).

Figure 8:
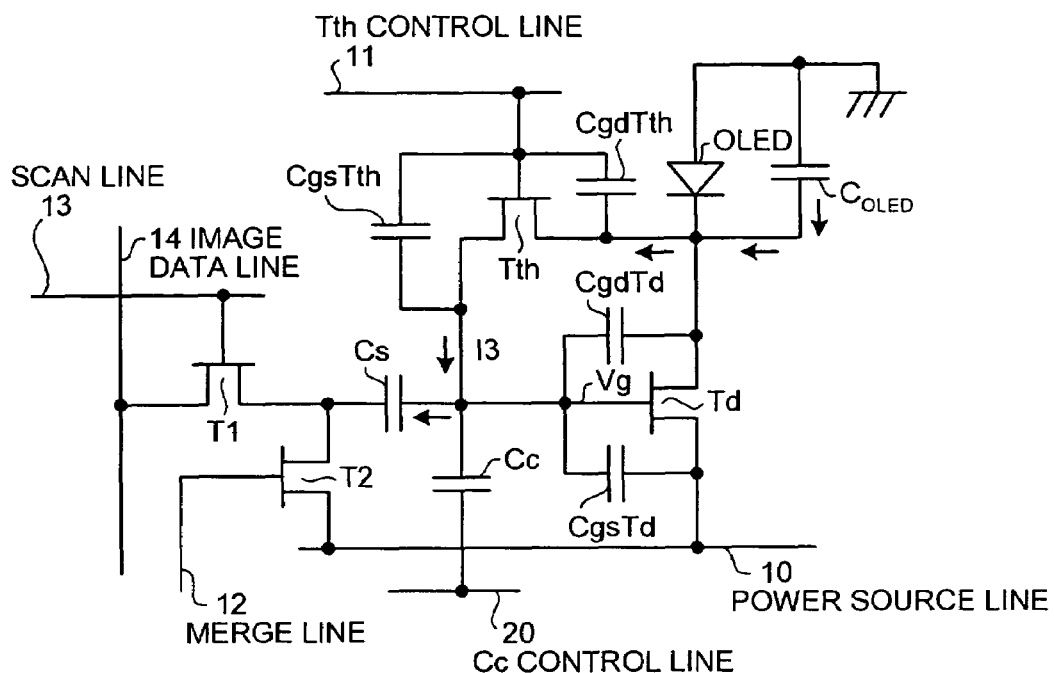
FIG. 8 is an explanatory diagram of an operation in a writing period shown in FIG. 5.

Then, as shown in FIG. 8, the switching transistor T1 is turned ON, and the switching transistor T2 is turned OFF. Thus, the electric charges accumulated in the organic light emitting diode capacitor $C_{OLED}$ are discharged to cause an electric current I3 to flow from the organic light emitting diode capacitor $C_{OLED}$, the threshold voltage detecting transistor Tth, and to the supplementary capacitor Cs. Thus, the electric charges are accumulated in the supplementary capacitor Cs. In other words, the electric charges accumulated in the organic light emitting diode capacitor $C_{OLED}$ move to the supplementary capacitor Cs.

Here, provided that the variable capacitor Cc and the Cc control line 20 do not exist, the gate potential Vg of the driving transistor Td can be represented by equation (1):

$$Vg = Vth - (Cs/Call) \cdot Vdata \quad (1)$$

where Vth stands for the threshold voltage of the driving transistor Td, Cs stands for the capacitance of the supplementary capacitor Cs, and Call represents the entire capacitance (i.e., static capacitance and parasitic capacitance connected to the gate of the driving transistor Td) when the threshold voltage detecting transistor Tth is ON. Note that the above assumption applies also to the following equations (2) to (11). Further, the potential difference VCs of the supplementary capacitor Cs can be represented by equation (2):

$$VCs = Vg - (-Vdata) = Vth + [(Call - Cs)/Call] \cdot Vdata \quad (2)$$

Further, the entire capacitance Call can be represented by equation (3):

$$Call = C_{OLED} + Cs + CgsTth + CgdTth + CgsTd \quad (3)$$

When the gate and the drain of the driving transistor Td are connected, CgdTd does not have any influence, since both ends of the CgdTd are of substantially the same potential. In addition, the relation between the supplementary capacitor Cs and the organic light emitting diode capacitor $C_{OLED}$ is set to be Cs<$C_{OLED}$.

Light Emitting Period

In the light emitting period, a potential of the power source line 10 is set to a minus potential (−$V_{DD}$), a potential of the merge line 12 is set to a high potential (VgH), a potential of the Tth control line 11 is set to a low potential (VgL), a potential of the scan line 13 is set to a low potential (VgL), a potential of the image data line 14 is set to zero potential, and a potential of the Cc control line 20 is set to a low potential (VgL).

Figure 9:
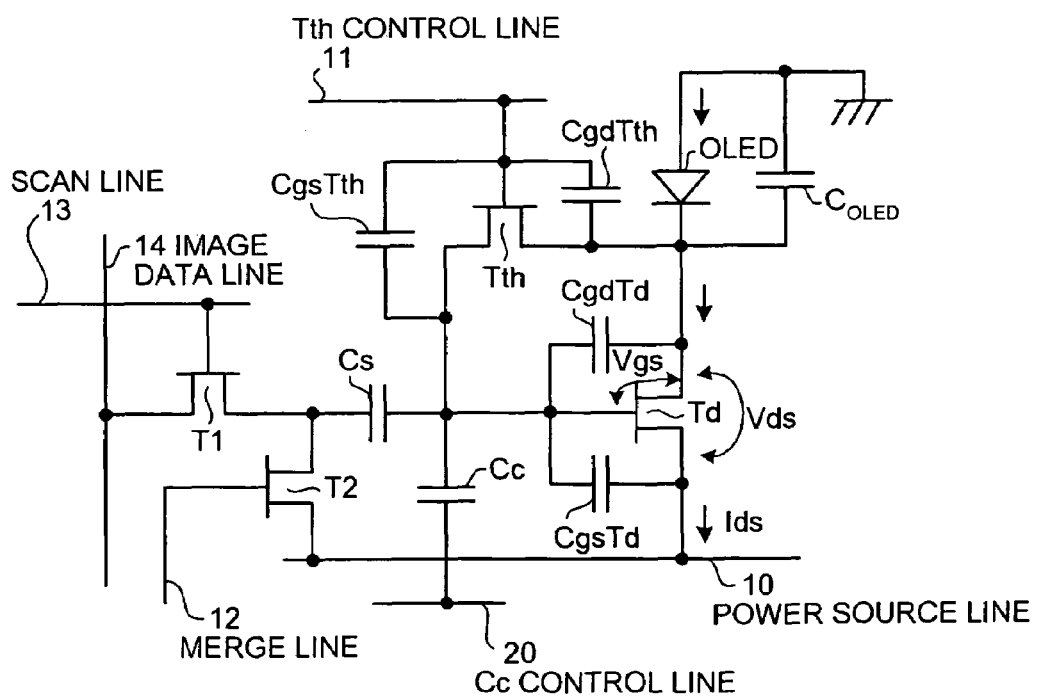
FIG. 9 is an explanatory diagram of an operation in a light emitting period shown in FIG. 5.

Then, as shown in FIG. 9, the driving transistor Td is turned ON, the threshold voltage detecting transistor Tth is turned OFF, and the switching transistor T1 is turned OFF. Then an electric current Ids flows from the organic light emitting diode OLED, the driving transistor Td, and to the power source line 10, whereby the organic light emitting diode OLED emits light.

The electric current Ids which flows from the drain to the source of the driving transistor Td can be represented by equation (4):

$$Ids = (\beta/2)(Vgs - Vth)^2 \quad (4)$$

where β represents a constant determined by the structure and the material of the driving transistor Td, Vgs represents the gate-to-source potential of the driving transistor Td, and Vth represents threshold voltage of the driving transistor Td.

Here, provided that the pixel circuit does not have the parasitic capacitance, the gate-to-source potential Vgs of the driving transistor can be represented by equation (5):

$$Vgs = Vth + C_{OLED}/(Cs + C_{OLED}) \cdot Vdata \quad (5)$$

Further, the electric current Ids can be represented by equation (6):

$$Ids = (\beta/2)(C_{OLED}/(Cs + C_{OLED}) \cdot Vdata)^2$$

$$= a \cdot Vdata^2 \quad (6)$$

As can be seen from equation (6), when the parasitic capacitance CgdTd, and the parasitic capacitance CgsTd are assumed to be absent, the electric current Ids which does not depend on the threshold voltage Vth can be obtained. Since the brightness of the organic light emitting diode OLED is proportionate to the electric current Ids, the brightness also does not depend on the threshold voltage Vth.

In practice, however, since the pixel circuit has the parasitic capacitance, the influence of the threshold voltage Vth cannot be completely eliminated. When the parasitic capacitance is taken into consideration, the drain-to-source potential Vds of the driving transistor Td during the writing period (see FIG. 5) can be represented by equation (7):

$$Vds = Vgs = Vth - (Cs/Call) \cdot Vdata \quad (7)$$

Further, the potential Vds in the light emitting period (see FIG. 9) can be represented by equation (8):

$$Vds \approx V_{DD} - Vth_{OLED} \quad (8)$$

where Vtholed represents a voltage drop in the organic light emitting diode OLED.

Further, an amount of change ΔVds of the potential Vds can be represented by equation (9):

$$\Delta Vds = V_{DD} - Vth_{OLED} - Vth + (Cs/Call) \cdot Vdata \quad (9)$$

Further, since the parasitic capacitor CgdTd is present, the potential Vgs also changes. The change ΔVgs of the potential Vgs can be represented by equation (10):

$$\Delta Vgs = (CgdTd/Call') \cdot \Delta Vds$$

$$= (CgdTd/Call') (V_{DD} - Vth_{OLED} - Vth + (Cs/Call) \cdot Vdata) \quad (10)$$

In equation (10), Call' represents the entire capacitance (static capacitance and parasitic capacitance connected to the gate of the driving transistor Td) when the threshold voltage detecting transistor Tth is OFF. The value Call' can be represented by equation (11):

$$Call' = Cs + CgsTth + CgsTd + CgdTd \quad (11)$$

In equation (10), the value of [(CgdTd/Call')($V_{DD}$−Vth$_{OLED}$+(Cs/Call)·Vdata)] is substantially the same for all pixels, hence any particular problems arise. However, in equation (10), the value of (CgdTd/Call')Vth is different for each pixel according to the threshold voltage Vth, and hence is generally regarded as the cause of the fluctuation in luminance of pixels. In conventional pixel circuits with any structure, the value of Vds changes at the light emission, and hence the change in Vgs via the parasitic capacitor CgdTd cannot be prevented. Hence, the display cannot be completely uniform, in other words, unevenness, burn-in, and degradation of display luminance occur.

Hence, in the first embodiment, the variable capacitor Cc is provided to address such inconveniences. The variable capacitor Cc has a larger capacitance for higher potential difference V12, whereas has a smaller capacitance for lower potential difference V12 as mentioned earlier.

Here, the value of the variable capacitor Cc for the potential difference V12 equal to or higher than the first threshold is indicated as Ccon, and the value of the variable capacitor Cc for the potential difference V12 equal to or lower than the second threshold is indicated as Ccoff (<Ccon). Here, the difference ΔCc can be represented by equation (12):

$$\Delta Cc = Ccon - Ccoff \quad (12)$$

In addition, the entire capacitance Call and the entire capacitance Call' can be represented by equations (13) and (14), respectively:

$$\text{Call} = C_{OLED} + Cs + CgsTth + CgdTth + CgsTd + Ccon \quad (13)$$

In the threshold voltage detecting period and the writing period shown in FIG. 5, a potential of the Cc control line 20 is set to a high potential (VgH), and a potential of the potential difference V12 is set to a level equal to or higher than the first threshold. Then the variable capacitor Cc attains the value of Ccon. Then, in the light emitting period, a potential of the Cc control line 20 is set to a low potential (VgL), and a potential of the potential difference V12 is set to a level equal to or lower than the second threshold. Then the variable capacitor Cc attains the value of Ccoff. Here, the value of Vgs changes during the light emitting period, which can be represented by equation (15):

$$Vgs = Vth + [(\text{Call} - Cs)/\text{Call}] \cdot Vdata + (CgdTd/\text{Call}') [V_{DD} - Vth_{OLED} - Vth + (Cs/\text{Call})Vdata]$$

$$= [(\text{Call}' - CgdTd)/\text{Call}']Vth + a \cdot Vdata + d \quad (15)$$

where the characters "a" and "d" are constants.

Further, when the variable capacitor Cc attains the value of Ccoff, according to the law of conservation of charge represented by equation (16), Vgs becomes Vgs' which can be represented by equation (17):

$$Q = \text{Call}' \cdot Vgs = (\text{Call}' - \Delta Cc)Vgs' \quad (16)$$

$$Vgs' = [\text{Call}'/(\text{Call}' - \Delta Cc)]Vgs$$

$$= [\text{Call}'/(\text{Call}' - \Delta Cc)][[\text{Call}' - CgdTd)/\text{Call}']Vth + a \cdot Vdata + d]$$

$$= [(\text{Call}' - CgdTd)/(\text{Call}' - \Delta Cc)]Vth + a' \cdot Vdata + d' \quad (17)$$

where the characters "a'" and "d'" represent constants.

Hence, when the variable capacitor Cc is set to a value as to satisfy the difference ΔCc represented by the following equation (18), the coefficient of the threshold voltage Vth which is the first term on the right-hand side of equation (17) becomes one, and the dependency on the threshold voltage Vth is theoretically zero.

$$\Delta Cc = CgdTdon \quad (18)$$

When equation (18) holds, Vgs' in equation (17) can be simplified as equation (19):

$$Vgs' = a' \cdot Vdata + d' + Vth \quad (19)$$

When Vgs of equation (4) is substituted for by Vgs' of equation (19), the resulting Ids can be represented by equation (20):

$$Ids = (\beta/2)(a' \cdot Vdata + d')^2 \quad (20)$$

When the value of ΔCc is set to the theoretical value, there is no term of Vth in Ids represented by equation (20). Hence, the electric current Ids flowing from the drain to the source of the driving transistor Td does not theoretically depend on the threshold voltage Vth of the driving transistor Td. In other words, the amount of power distribution to the organic light emitting diode in the light emitting period becomes theoretically independent of the driving threshold Vth.

Further, when the value of ΔCc is not in the range of the theoretical value, Ids can be represented by equation (21):

$$Ids = (\beta/2)[[(\Delta Cc - CgdTd)/\text{Call}' - \Delta Cc)]Vth + a' \cdot Vdata + d']^2 \quad (21)$$

Then, the driving threshold Vth remains in Ids.

However, even when the value of ΔCc is not the theoretical value satisfying equation (18), when the value of ΔCc is set in the range within ±10%, for example, from the theoretical value, the fluctuation in luminance by the parasitic capacitance can be prevented to some extent. Then, the dependency on the driving threshold Vth can be reduced to decrease the amount of power distribution to the organic light emitting diode.

In the first embodiment, the potential on the Cc control line is controlled so that the value of the variable capacitor Cc changes more notably in the threshold voltage detecting period than in the light emitting period. In addition, the potential on the control line Cc is preferably controlled so that the value of the variable capacitor Cc is substantially constant in each of the threshold voltage detecting period and in the light emitting period.

In addition, the potential on the control line Cc is preferably controlled so that the capacitance of the variable capacitor changes from a small value to a large value during a period from the end of the light emitting period until the end of detection of the driving threshold (preferably more than 2 milliseconds (ms) prior to the end of detection of the driving threshold), and that the capacitance of the variable capacitor changes from a large value to a small value during a period from the end of the data writing period up to the start of light emission, or at the start of light emission by the organic light emitting diode OLED.

As described above, since the image display according to the first embodiment includes the variable capacitor Cc as the capacitance varying unit as mentioned above, the influence of the parasitic capacitance present in the driving transistor Td (driver), the threshold voltage detecting transistor Tth (threshold detecting unit) or the like can be reduced, whereby the fluctuation in luminance caused by the parasitic capacitance can be reduced. Thus, the image display according to the first embodiment can lengthen the life of the image display. Further, since the image display of the first embodiment saves troubles of changes in manufacturing process and in the layer structure, the application thereof is highly facilitated.

Further, though in the first embodiment, amorphous silicon TFT is used as elements of the threshold voltage detecting unit and the driving transistor, polycrystalline silicon TFT, or other types of TFT may be employed. Then, the material of the channel layer of the variable capacitor is preferably also selected in correspondence with the material forming the channel layer of the TFT.

Figure 10:
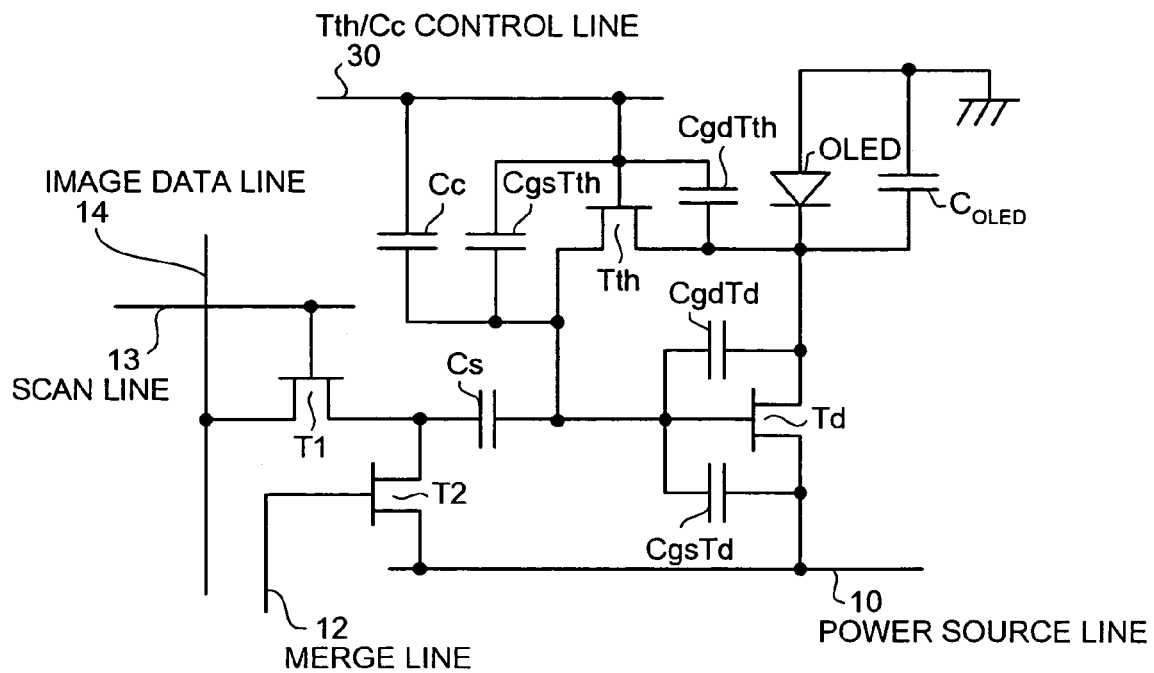
FIG. 10 is a diagram of a structure of a pixel circuit corresponding to one pixel in an image display according to a second embodiment of the present invention.

In the first embodiment, exemplary structures of the Tth control line 11 and the Cc control line 20 shown in FIG. 1 are described as separate lines. In a second embodiment, the Tth control line 11 and the Cc control line 20 are provided as a common Tth/Cc control line 30 as shown in FIG. 10, since any structure may be applicable as far as a high potential is supplied to the variable capacitance Cc in the threshold voltage detecting period and the writing period, and a low potential in the light emitting period. The potential on the Tth/Cc control line 30 changes similarly to the potential on the Tth control line 11 (Cc control line 20) as shown in FIG. 5.

Further, in the first embodiment, the variable capacitor Cc is applied to the pixel circuit of the structure as shown in FIG. 1. However, a pixel circuit with any connection structure may be employable as far as the pixel circuit has the driving transistor and the threshold voltage detecting transistor. The point is to connect the variable capacitor Cc which satisfies the requirements as described according to the first embodiment to the gate of the driving transistor.

Figure 11:
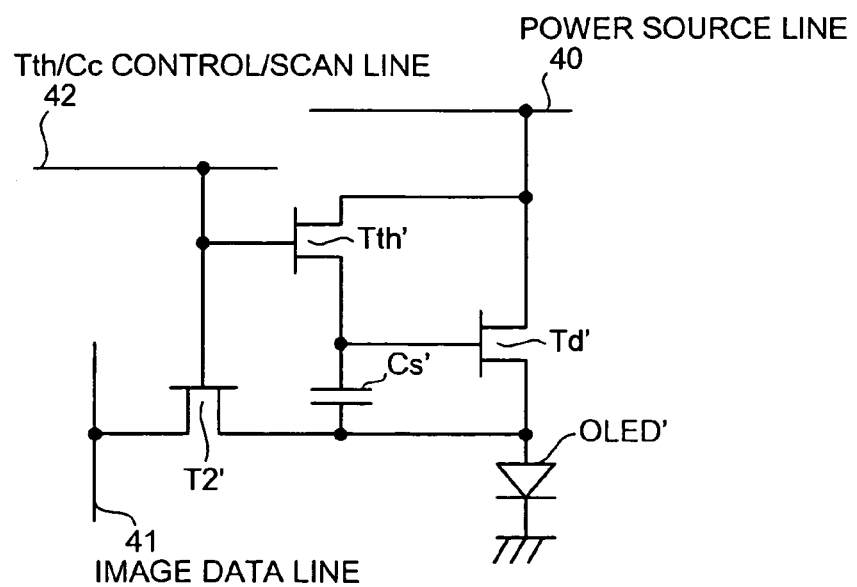
FIG. 11 is a diagram of a structure of a pixel circuit corresponding to one pixel in an electric current control type image display.

FIG. 11 is a diagram of a structure of a pixel circuit corresponding to one pixel of the image display of the electric current control type. The pixel circuit of FIG. 11 includes a threshold voltage detecting transistor Tth', an organic light emitting diode OLED', a driving transistor Td', a switching transistor T2', a supplementary capacitor Cs', a power source line 40, an image data line 41, and a Tth control/scan line 42.

Figure 12:
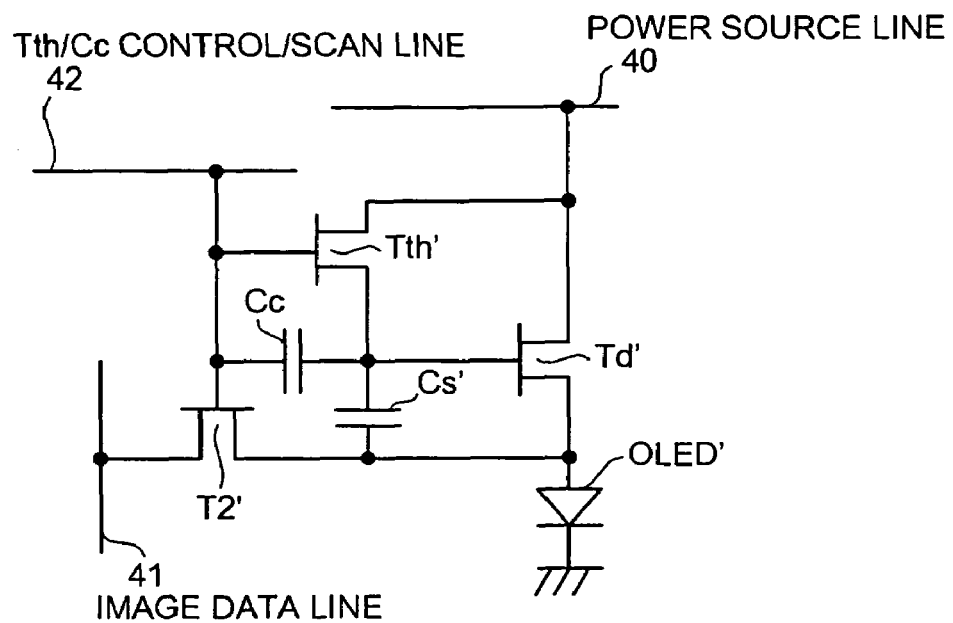
FIG. 12 is a diagram of a structure of a pixel circuit corresponding to one pixel in an image display according to a third embodiment of the present invention.

The variable capacitor Cc is also applicable to the pixel circuit of the electric current control type as shown in FIG. 11. Then, a pixel circuit with a structure as shown in FIG. 12 can be formed, where the variable capacitor Cc is connected between the gate of the driving transistor Td' and the gate of the threshold voltage detecting transistor Tth'.

Figure 13:
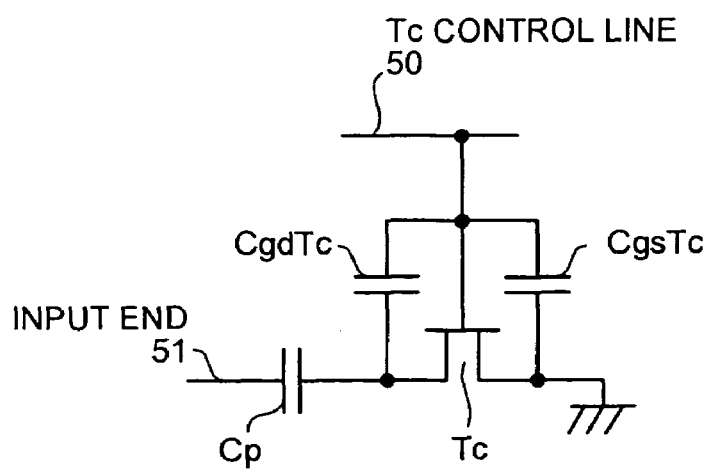
FIG. 13 is a diagram of a structure of a capacitance varying unit according to a fourth embodiment of the present invention.

FIG. 13 is a diagram of a structure of a capacitance varying unit according to a fourth embodiment of the present invention. In the capacitance varying unit shown in FIG. 13, a circuit including a capacitor and a TFT connected in series is employed in place of the variable capacitance Cc shown in FIGS. 3A and 3B. In the circuit shown in FIG. 13, to a fixed capacitor Cp, a switching transistor Tc which is a thin film transistor, for example, is connected in series, and further to a gate end of the switching transistor Tc a Tc control line 50 is connected. Further, similarly to other switching transistors described above, a parasitic capacitor CgdTc and a parasitic capacitor CgsTc are present between the drain end and the gate end, and between the source end and the gate end of the switching transistor Tc, respectively.

Further, change in the capacitance before and after the conduction/non-conduction of the switching transistor Tc of the capacitance varying unit will be described. When the switching transistor Tc is conductive in FIG. 13, the fixed capacitance Cp is directly connected to the zero potential, and hence the capacitance to an input end 51 is Cp. On the other hand, when the switching transistor Tc is not conductive, the fixed capacitor Cp is connected to the zero potential via the parasitic capacitor CgdTc and the parasitic capacitor CgsTc, and hence, the fixed capacitance Cp' to the input end 51 can be represented by equation (22):

$$Cp'=1/(1/Cp+1/CgdTc) \quad (22)$$

Hence, the change in capacitance between non-conduction and conduction of the switching transistor Tc can be represented by equation (23):

$$\Delta Cp=Cp-Cp' \quad (23)$$

where $\Delta Cp$ represents the change in capacitance between non-conduction and conduction.

Figure 14:
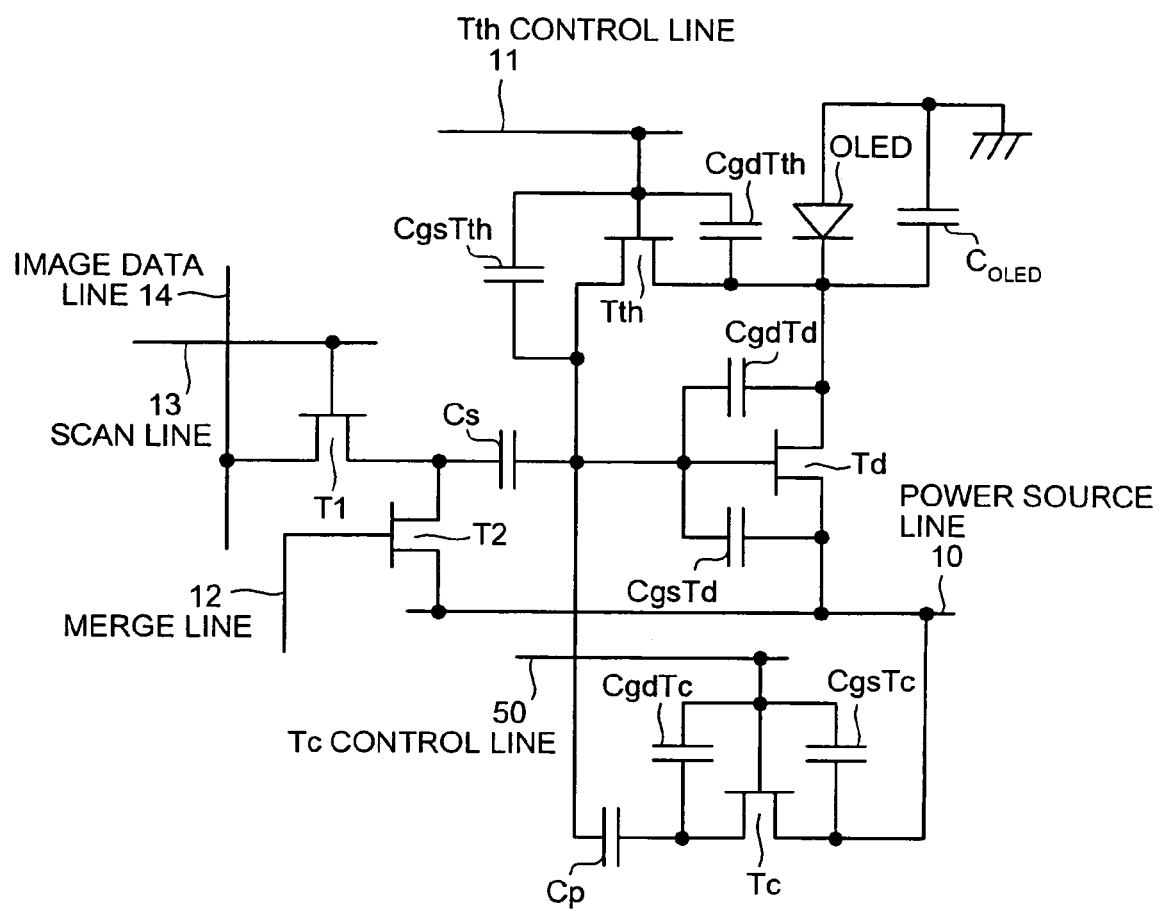
FIG. 14 is a diagram of a structure of a pixel circuit corresponding to one pixel of the image display according to the fourth embodiment where the capacitance varying unit of FIG. 13 is applied.

FIG. 14 is a diagram of a structure of a pixel circuit corresponding to one pixel in the image display according to the fourth embodiment where the capacitance varying unit of FIG. 13 is employed. In the pixel circuit of FIG. 14, the input end 51 of the capacitance varying unit of FIG. 13 is connected to the gate end of the driving transistor Td, and a ground end is connected to the power source line. In other respects, the structure of the pixel circuit of FIG. 14 is equivalent to the pixel circuit of FIG. 18.

Next, an operation of the pixel circuit according to the fourth embodiment will be described. In FIG. 14, a potential of the Tc control line 50 is set to a high potential (VgH), to provide an additional capacitance of Cp, and then Vth detection and writing is performed. Then, a potential of the Tc control line 50 is set to a low potential (VgL) which is a potential at the light emission. Then the value of Vgs changes similarly in the pixel circuit according to the first embodiment. The change in the value of Vgs here can be represented by equation (15) described above.

Further, since the law of conservation of charge represented by equation (24) stands similarly to the first embodiment at the transition of the capacitance of the capacitance varying unit from Cp to Cp', Vgs represented by equation (15) changes to Vgs' represented by equation (25):

$$Q=Call' \cdot Vgs=(Call'-\Delta Cp)Vgs' \quad (24)$$

$$Vgs'=[Call'/(Call'-\Delta Cp)]Vgs$$

$$=[Call'/(call'-\Delta Cp)][[(Call'-CgdTd)/Call']Vth+ a \cdot V\text{data}+d]$$

$$=[Call'-CgdTd)/(Call'-\Delta Cp)]Vth+a' \cdot V\text{data}+d' \quad (25)$$

where "a," "a'," "d," "d'," are same with those in equations (16) and (17).

Hence, when the capacitance value Cp is set so as to satisfy a difference $\Delta Cp$ represented by the following equation (26), the coefficient of the threshold voltage Vth which is the first term of the right-hand side of equation (25) becomes one and the dependency to the threshold voltage Vth becomes theoretically zero.

$$\Delta Cp=Cp-Cp'=Cp \cdot [1-CgdTc/(Cp+CgdTc)]=CgdTd \quad (26)$$

When equation (26) holds, Vgs' of equation (25) can be simplified as equation (19) described above.

Further, the resulting Ids can be represented as equation (20) described above.

When the value of $\Delta Cc$ is set to the theoretical value, Ids represented in equation (20) does not have the term Vth, and hence, the value of the electric current Ids flowing from the drain to the source of the driving transistor Td does not theoretically depend on the threshold voltage Vth of the driving transistor Td. In other words, the influence to the driving threshold Vth of the amount of power distribution to the organic light emitting diode during the light emitting period can be eliminated theoretically.

Further, when the value of $\Delta Cp$ is not in the range of the theoretical value, the value of Ids can be represented by equation (27):

$$Ids=(\beta/2)[[\Delta Cc-CgdTd)/(Call'-\Delta Cp)]Vth+a' \cdot V\text{data}+ d']^2 \quad (27)$$

Hence, the driving threshold Vth remains in Ids.

However, even when the value of $\Delta Cc$ is not the theoretical value satisfying equation (18), when the value of $\Delta Cp$ is set in the range within ±10%, for example, from the theoretical value, the fluctuation in luminance by the parasitic capacitance can be prevented to some extent. Then, the dependency on the driving threshold Vth can be reduced to decrease the amount of power distribution to the organic light emitting diode.

Figure 15:
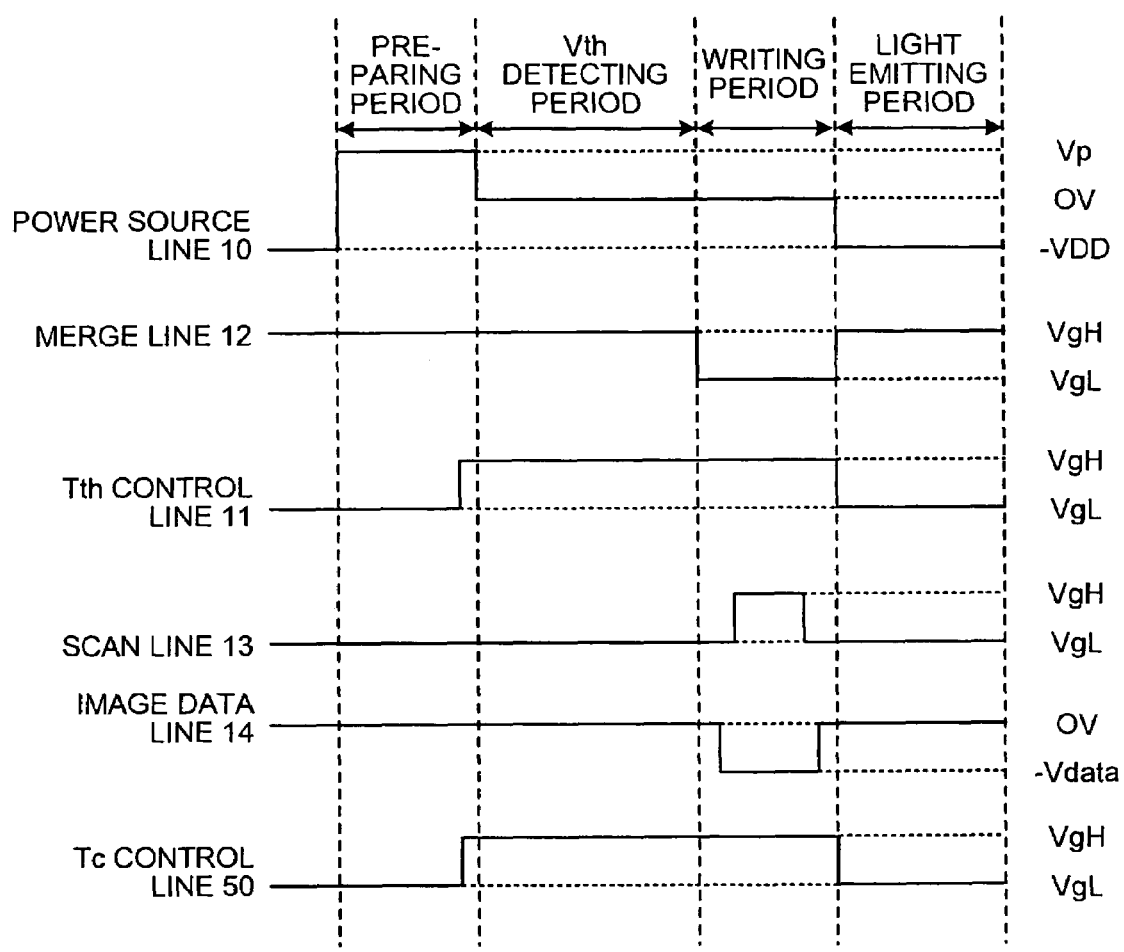
FIG. 15 is a sequence diagram of a driving waveform of a Tc control line.

Further, FIG. 15 is a sequence diagram of driving waveform of the Tc control line. As shown in FIG. 15, a potential of the Tc control line is set to a high potential at the Vth detection and the writing, whereas is set to a low potential at the light emission.

Figure 16:
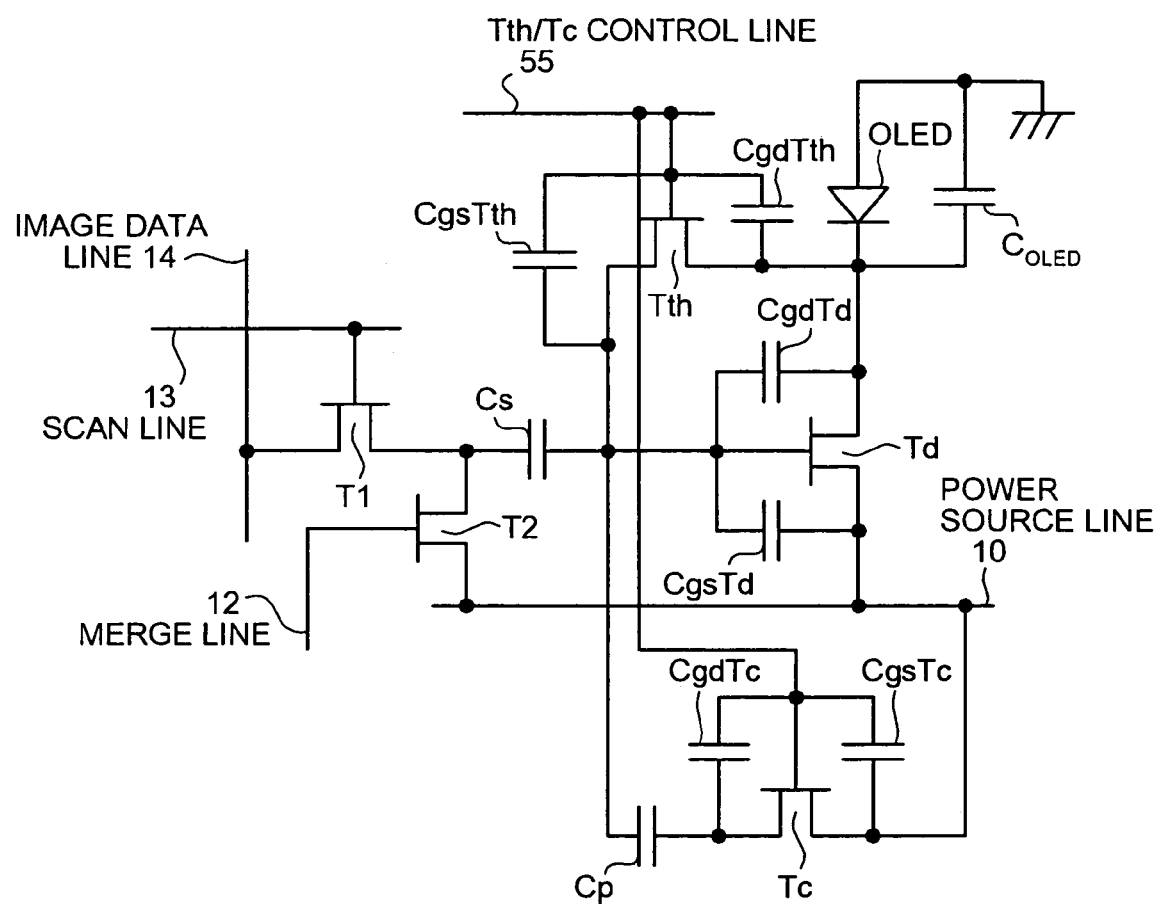
FIG. 16 is a diagram of an illustrative structure of a pixel circuit including a Tth/Tc control line 55 which serves as a combination of a Tth control line 11 and a Tc control line 50.
Figure 17:
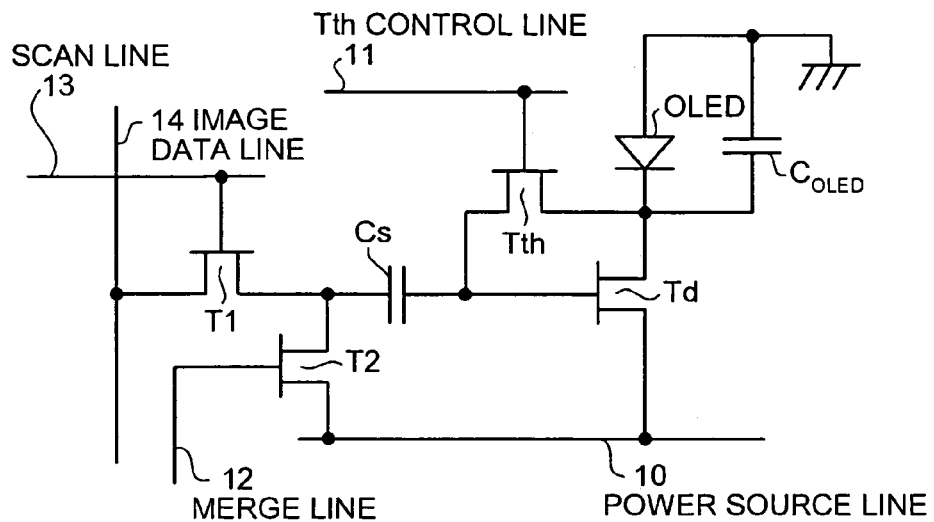
FIG. 17 is a diagram of a structure of a pixel circuit corresponding to a pixel in the conventional image display.

Still further, as is clear from FIG. 15, potentials of both the Tc control line and the Tth control line are set to a high potential and a low potential at the same timing. Hence the Tc control line and the Tth control line can be provided as a common line and a change in an external driving device is not required. An exemplary structure of a pixel circuit employing a common Tth/Tc control line 55 in place of separate Tth control line 11 and the Tc control line 50 is shown in FIG. 16.

As described above, the image display according to the third embodiment includes the capacitance varying unit formed as the circuit including the capacitance and the switching transistor connected in series. Hence, the influence of the parasitic capacitance present in the driving transistor Td (driver), the threshold voltage detecting transistor Tth (threshold detecting unit) or the like can be reduced, whereby the fluctuation in luminance caused by the parasitic capacitance can be reduced.

In the image display according to the fourth embodiment, similarly to the first embodiment, polycrystalline silicon TFT and other types of TFT may be applicable in addition to the amorphous silicon TFT for devices such as the threshold voltage detecting unit and the driving transistor.

Though the pixel circuit shown in FIG. 14 employs the structure with the capacitance varying unit for the pixel circuit of the voltage control type, similar capacitance varying unit can be applied to a pixel circuit of an electric current control type. Then, the capacitance varying unit may be connected between the gate of the driving transistor Td' and the gate of the threshold voltage detecting transistor Tth', similarly to the exemplary structure of the third embodiment shown in FIG. 12.

Figure 19:
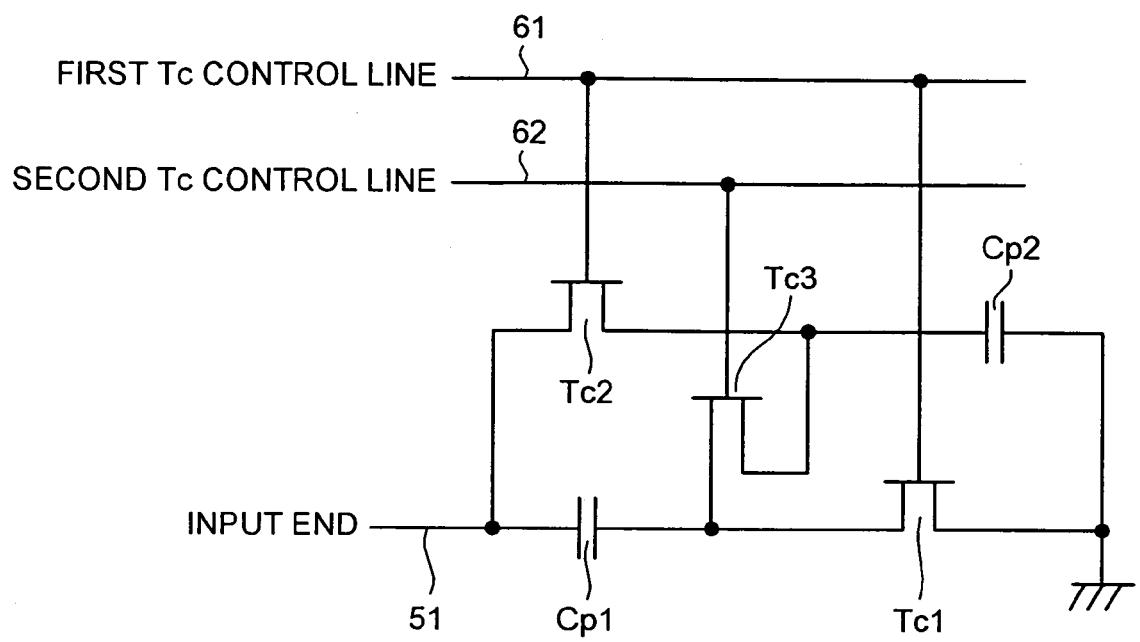
FIG. 19 is a diagram of a structure of a capacitance varying unit according to a fifth embodiment of the present invention.

FIG. 19 is a diagram of a structure of a capacitance varying unit according to a fifth embodiment of the present invention. In the capacitance varying unit shown in FIG. 19, a circuit including a capacitor and a TFT connected in series is employed as in the fourth embodiment. In the circuit shown in FIG. 19, to a fixed capacitor Cp1, a switching transistor Tc1 which is a thin film transistor, for example, is connected in series, and to a fixed capacitor Cp2, a switching transistor Tc2 which is a thin film transistor, for example, is connected in series. Further each of gate ends of the switching transistors Tc1 and Tc2 is connected to a first Tc control line 61. The circuit shown in FIG. 19 further includes a switching transistor Tc3 which is a thin film transistor. Specifically, the source of the switching transistor Tc is connected between the fixed capacitor Cp1 and the switching transistor Tc1, and the drain of the switching transistor Tc is connected between the fixed capacitor Cp2 and the switching transistor Tc2. The gate of the switching transistor Tc3 is connected to the second Tc control line 62.

Further, change in the capacitance before and after the conduction/non-conduction of the switching transistors Tc1, Tc2, and Tc3 of the capacitance varying unit will be described. When the switching transistors Tc1 and Tc2 are conductive in FIG. 19 and the switching transistor Tc3 is not conductive, a capacitance to an input end 51 is Cp1+Cp2. On the other hand, when the switching transistors Tc1 and Tc2 are not conductive and the switching transistor Tc3 is conductive, a capacitance to the input end 51 is 1/(1/Cp1+1/Cp2).

Figure 20:
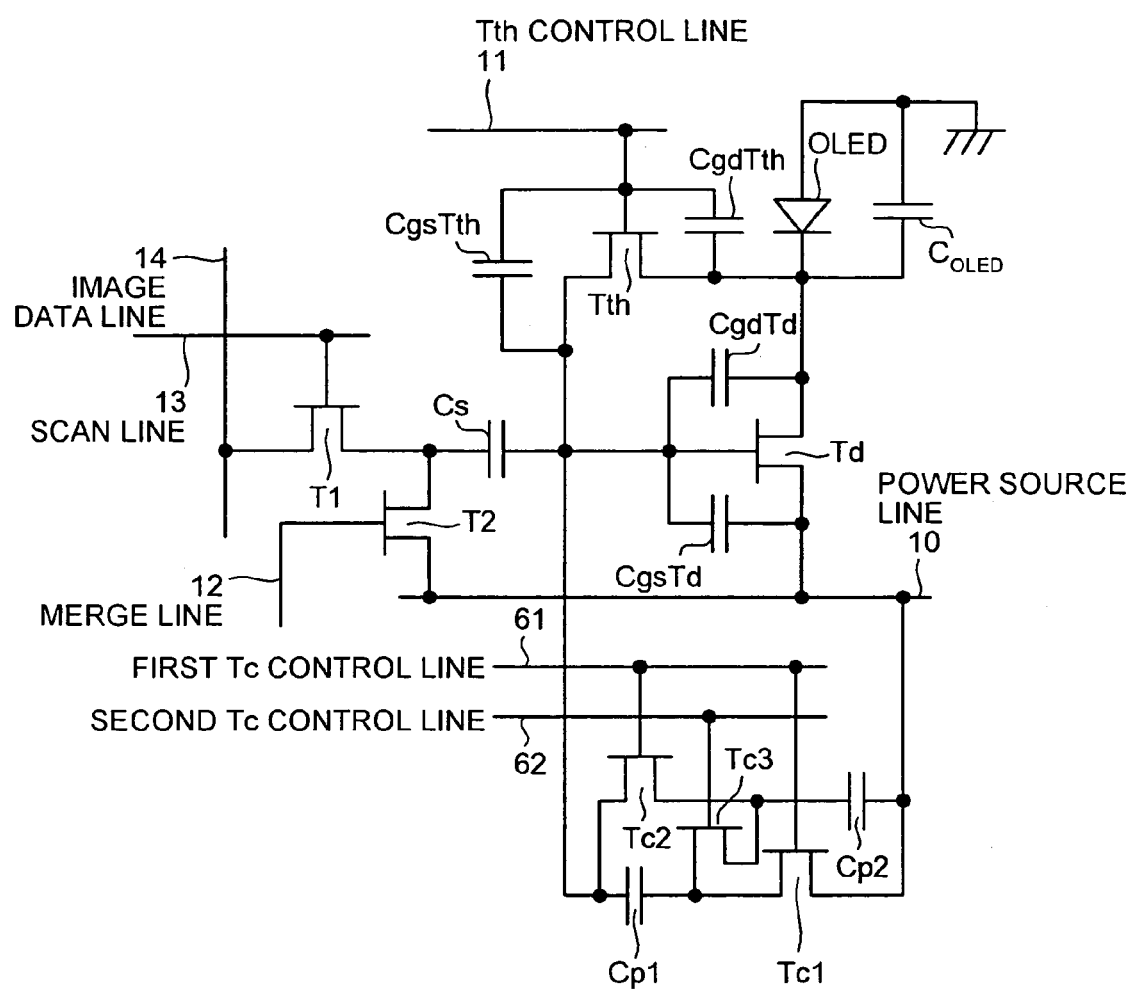
FIG. 20 is a diagram of a structure of a pixel circuit corresponding to one pixel of the image display according to the fifth embodiment where the capacitance varying unit of FIG. 19 is applied.

FIG. 20 is a diagram of a structure of a pixel circuit corresponding to one pixel in the image display according to the fifth embodiment where the capacitance varying unit of FIG. 19 is employed. In the pixel circuit of FIG. 19, the input end 51 of the capacitance varying unit is connected to the gate end of the driving transistor Td, and a ground end is connected to the power source line. In other respects, the structure of the pixel circuit of FIG. 20 is equivalent to the pixel circuit of FIG. 18.

Next, an operation of the pixel circuit according to the fifth embodiment will be described. In FIG. 20, a potential of the first Tc control line 61 is set to a high potential (VgH), to provide an additional capacitance of Cp1+Cp2, and then Vth detection and writing is performed. The value of Vgs here can be represented by equation (28):

$$Vgs = Vth + [(Call + Cp1 + Cp2 - Cs)/(Call + Cp1 + Cp2)] \cdot Vdata \quad (28)$$

After the writing period, a potential of the first Tc control line 61 is set to a low potential (VgL). Each of Cp1 and Cp2 has the same capacitance Cpc, and stores charges of Cpc·Vgs. Then a potential of the second Tc control line 62 is set to a high potential (VgH), hence Vgs changes to Vgs' represented by equation (29):

$$Vgs' = Vgs[(Call' + Cpc)/(Call' + Cpc/2)] \quad (29)$$

Figure 21:
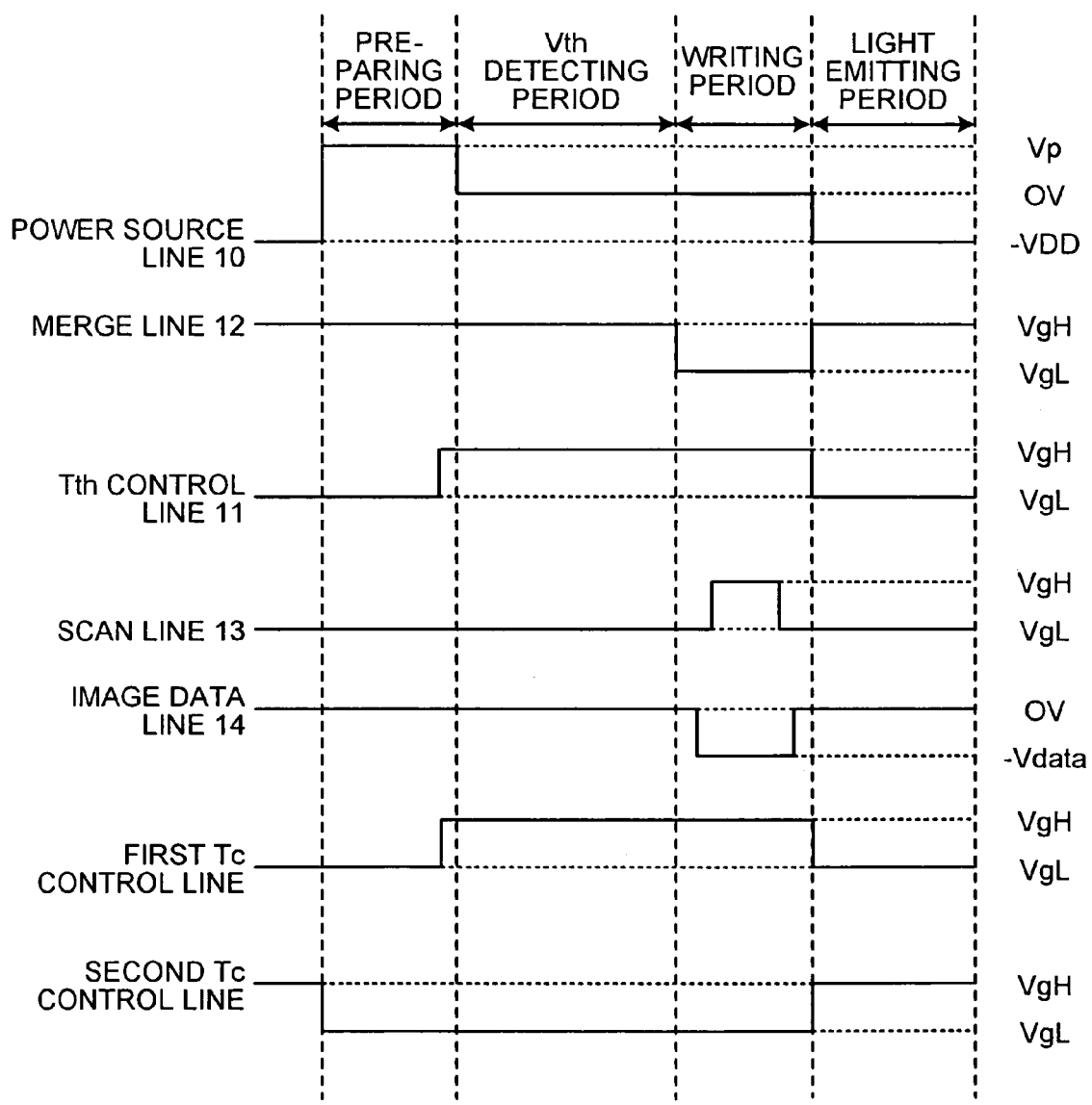
FIG. 21 is a sequence diagram of driving waveforms of a first Tc control line and a second Tc control line.

Next, each potential of the power line 10, the merge line 12, the second Tth control line 11, and other lines is set to the potential at the emitting period shown in FIG. 21, and accordingly Vgs changes as in the pixel circuit of the first embodiment. The change in Vgs is represented by Vgs" of equation (30):

$$Vgs'' = Vgs' + CgdTd/(Call' + Cps/2)[VDD - Vtholed - Vth + Cs/(Call + 2Cpc)Vdata]$$

$$= [(Call' + Cpc)(Call' + Cpc/2 - CgdTd)/(Call' + Cpc/2)^2] Vth + a \cdot Vdata + d \quad (30)$$

where "a," "d," are the same with those in equations (16) and (17). If Call'>>Cpc and Call'>>CgdTd, the capacitance value Cpc is set so as to satisfy the following equation (31), the coefficient of the threshold voltage Vth which is the first term of the right-hand side of equation (30) becomes one and the dependency to the threshold voltage Vth becomes theoretically zero.

$$Cpc/2 = CgdTd \quad (31)$$

$$Vgs'' - Vth = a \cdot Vdata + d \quad (32)$$

Hence, the value of the electric current Ids flowing from the drain to the source of the driving transistor Td does not theoretically depend on the threshold voltage Vth of the driving transistor Td. In other words, the influence of the driving threshold Vth of the amount of power distribution to the organic light emitting diode during the light emitting period can be eliminated theoretically.

FIG. 21 is a sequence diagram of driving waveforms of the first Tc control line and the second Tc control line. As shown in FIG. 21, a potential of the first Tc control line 61 is set to a high potential at the Vth detection and the writing, whereas is set to a low potential at the light emission.

Further, as is clear from FIG. 21, potentials of both the first Tc control line and the Tth control line are set to a high potential and a low potential at substantially the same timing. Hence the first Tc control line and the Tth control line can be provided as a common line and the number of control lines between each pixel and an external driving device is reduced. An exemplary structure of a pixel circuit employing a common Tth/Tc control line 65 in place of the Tth control line 11 and the first Tc control line 61 is shown in FIG. 22.

As described above, the image display according to the fifth embodiment includes the capacitance varying unit formed as the circuit including the capacitance and the switching transistor connected in series. Hence, the influence of the parasitic capacitance present in the driving transistor Td (driver), the threshold voltage detecting transistor Tth (threshold detecting unit) or the like can be reduced, whereby the fluctuation in luminance caused by the parasitic capacitance can be reduced.

In the image display according to the fifth embodiment, similarly to the first embodiment, polycrystalline silicon TFT and other types of TFT may be applicable in addition to the amorphous silicon TFT for devices such as the threshold voltage detecting unit and the driving transistor.

Figure 22:
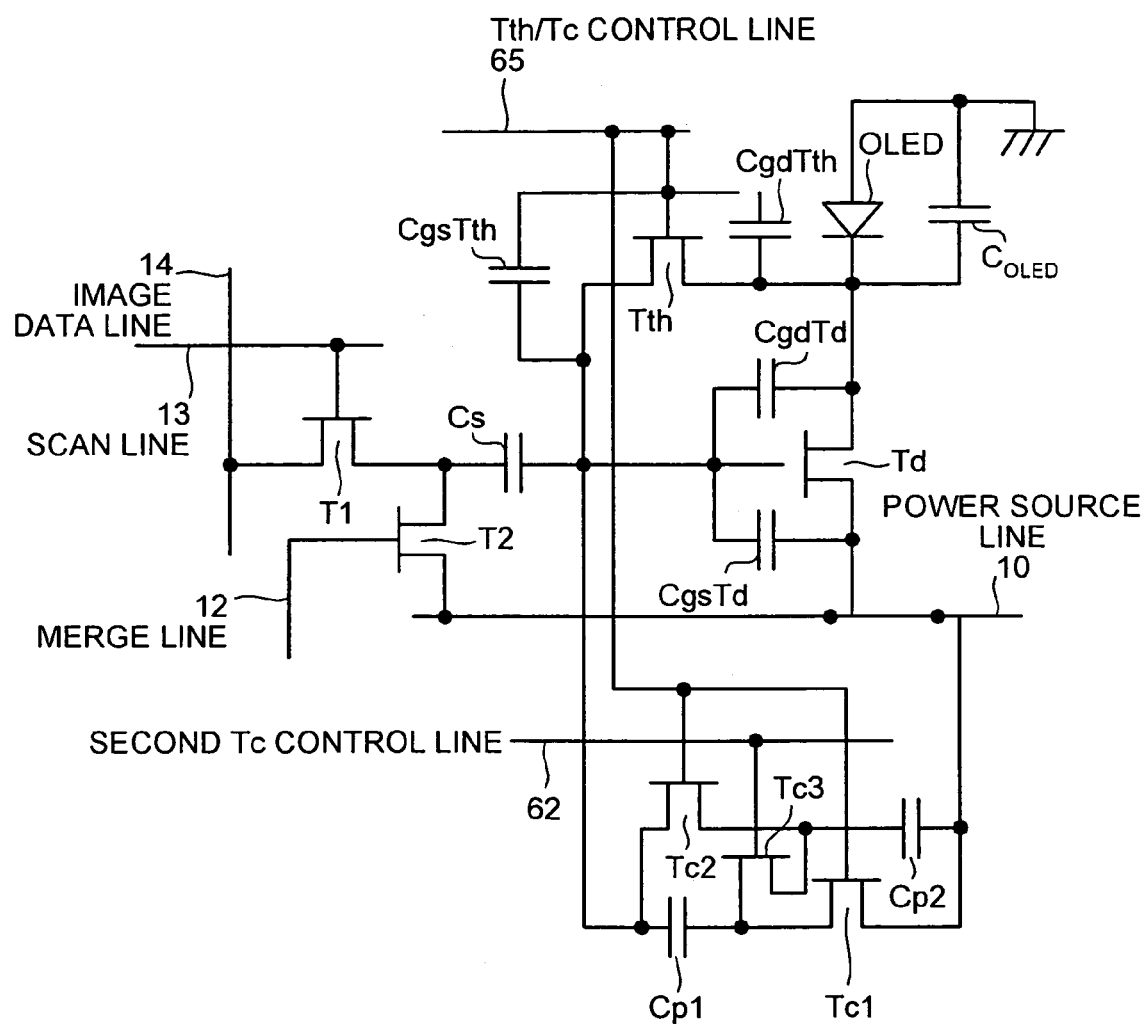
FIG. 22 is a diagram of an illustrative structure of a pixel circuit including a Tth/Tc control line 65 which serves as a combination of a first Tth control line 61 and a Tc control line 50.

Though each pixel circuit shown in FIGS. 20 and 22 employs the structure with the capacitance varying unit for the pixel circuit of the voltage control type, similar capacitance varying unit can be applied to a pixel circuit of an electric current control type. Then, the capacitance varying unit may be connected between the gate of the driving transistor Td' and the gate of the threshold voltage detecting transistor Tth', similarly to the exemplary structure of the third embodiment shown in FIG. 12.

As can be seen from the foregoing, the image display according to the present invention is useful for the prevention of fluctuation in luminance caused by the parasitic capacitance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An image display comprising:
    a variable capacitor including
        a first electrode,
        an insulation layer disposed on the first electrode,
        a channel layer disposed on the insulation layer, and
        a second electrode disposed on the channel layer and smaller in area than the first electrode.
2. The image display according to claim 1, wherein the channel layer changes electric conductivity according to a potential difference between the first electrode and the second electrode.

* * * * *